(12) United States Patent
Tsai et al.

(10) Patent No.: US 11,387,323 B2
(45) Date of Patent: Jul. 12, 2022

(54) EXTENDED DRAIN MOS WITH DUAL WELL ISOLATION

(71) Applicant: Texas Instruments Incorporated, Dallas, TX (US)

(72) Inventors: Chin-yu Tsai, Allen, TX (US); Guruvayurappan Mathur, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/931,935

(22) Filed: Jul. 17, 2020

(65) Prior Publication Data

US 2020/0350405 A1     Nov. 5, 2020

Related U.S. Application Data

(62) Division of application No. 16/368,102, filed on Mar. 28, 2019, now Pat. No. 10,756,187.

(51) Int. Cl.
    *H01L 29/10*     (2006.01)
    *H01L 27/092*     (2006.01)
    (Continued)

(52) U.S. Cl.
CPC ...... *H01L 29/1083* (2013.01); *H01L 21/2253* (2013.01); *H01L 21/266* (2013.01);
(Continued)

(58) Field of Classification Search
CPC ......... H01L 29/00; H01L 29/78; H01L 29/66; H01L 29/45; H01L 29/1083; H01L 29/1095; H01L 29/7816; H01L 29/94; H01L 29/66681; H01L 29/0922; H01L 29/0603; H01L 29/7803; H01L 29/66606; H01L 29/0615; H01L 29/7833; H01L 29/7801; H01L 29/0873; H01L 29/7835; H01L 29/66575; H01L 29/66659; H01L 29/78696; H01L 29/41766; H01L 29/41758; H01L 29/41733; H01L 29/66674; H01L 29/4175; H01L 21/74;
(Continued)

(56) References Cited

U.S. PATENT DOCUMENTS 6,137,140 A * 10/2000 Efland ................. H01L 27/0711
                                                                   257/139
6,875,650 B2     4/2005    Salling et al.
(Continued)

*Primary Examiner* — Chuong A Luu
(74) *Attorney, Agent, or Firm* — Jacqueline J. Garner; Charles A. Brill; Frank D. Cimino

(57) ABSTRACT

An integrated circuit includes an extended drain MOS transistor. The substrate of the integrated circuit has a lower layer with a first conductivity type. A drain well of the extended drain MOS transistor has the first conductivity type. The drain well is separated from the lower layer by a drain isolation well having a second, opposite, conductivity type. A source region of the extended drain MOS transistor is separated from the lower layer by a body well having the second conductivity type. Both the drain isolation well and the body well contact the lower layer. An average dopant density of the second conductivity type in the drain isolation well is less than an average dopant density of the second conductivity type in the body well.

20 Claims, 15 Drawing Sheets

(51) Int. Cl.
*H01L 29/45* (2006.01)
*H01L 29/78* (2006.01)
*H01L 21/265* (2006.01)
*H01L 21/8238* (2006.01)
*H01L 21/225* (2006.01)
*H01L 21/324* (2006.01)
*H01L 21/285* (2006.01)
*H01L 21/74* (2006.01)
*H01L 29/66* (2006.01)
*H01L 21/266* (2006.01)

(52) U.S. Cl.
CPC .. *H01L 21/26513* (2013.01); *H01L 21/28518* (2013.01); *H01L 21/324* (2013.01); *H01L 21/74* (2013.01); *H01L 21/823814* (2013.01); *H01L 21/823892* (2013.01); *H01L 27/0922* (2013.01); *H01L 29/1095* (2013.01); *H01L 29/45* (2013.01); *H01L 29/66681* (2013.01); *H01L 29/7816* (2013.01)

(58) Field of Classification Search
CPC . H01L 21/324; H01L 21/2253; H01L 21/266; H01L 21/26513; H01L 21/28518; H01L 21/823814; H01L 21/823892; H01L 29/06; H01L 29/10; H01L 29/423; H01L 29/665; H01L 29/1041; H01L 29/42368; H01L 29/0653; H01L 29/66689
USPC .................................................. 438/270, 289
See application file for complete search history.

(56) References Cited

U.S. PATENT DOCUMENTS

| | | |
|---|---|---|
| 9,735,265 B2 | 8/2017 | Zhang et al. |
| 2007/0254426 A1 | 11/2007 | Wake et al. |
| 2008/0246086 A1* | 10/2008 | Korec ................ H01L 29/4175 257/343 |
| 2008/0272408 A1 | 11/2008 | Vora |
| 2009/0159968 A1 | 6/2009 | Zhang et al. |
| 2010/0244130 A1 | 9/2010 | Bulucea et al. |
| 2014/0203358 A1 | 7/2014 | Yang et al. |
| 2015/0179793 A1 | 6/2015 | Denison et al. |
| 2016/0197080 A1 | 7/2016 | Campi, Jr. et al. |
| 2019/0120830 A1 | 4/2019 | Hoffman |

* cited by examiner

EXTENDED DRAIN MOS WITH DUAL WELL ISOLATION

CROSS REFERENCE TO RELATED APPLICATIONS

This application is a divisional of U.S. Nonprovisional patent application Ser. No. 16/368,102, filed Mar. 28, 2019, the contents of which is herein incorporated by reference in its entirety.

FIELD

This disclosure relates to the field of integrated circuits. More particularly, this disclosure relates to extended drain metal oxide semiconductor (MOS) transistors in integrated circuits.

BACKGROUND

Some integrated circuits include extended drain metal oxide semiconductor (MOS) transistors with drains having the same conductivity type as the underlying substrate. The drains must be isolated from the substrate, which involves added process complexity or increased component area, or both. Providing the isolation without degrading the performance and reliability parameters of the transistor, such as on-state current, off-state current, threshold, and hot carrier reliability, has proven to be challenging.

SUMMARY

The present disclosure introduces an integrated circuit including an extended drain metal oxide semiconductor (MOS) transistor, located over a lower layer in a substrate of the integrated circuit. A drain well of the extended drain MOS transistor and the lower layer both have a first conductivity type. The drain well is separated from the lower layer by a drain isolation well having a second conductivity type, opposite from the first conductivity type. A source region of the extended drain MOS transistor is separated from the lower layer by a body well having the second conductivity type. Both the drain isolation well and the body well contact the lower layer. An average dopant density of the second conductivity type in the drain isolation well is less than an average dopant density of the second conductivity type in the body well.

DETAILED DESCRIPTION

Figure 1:
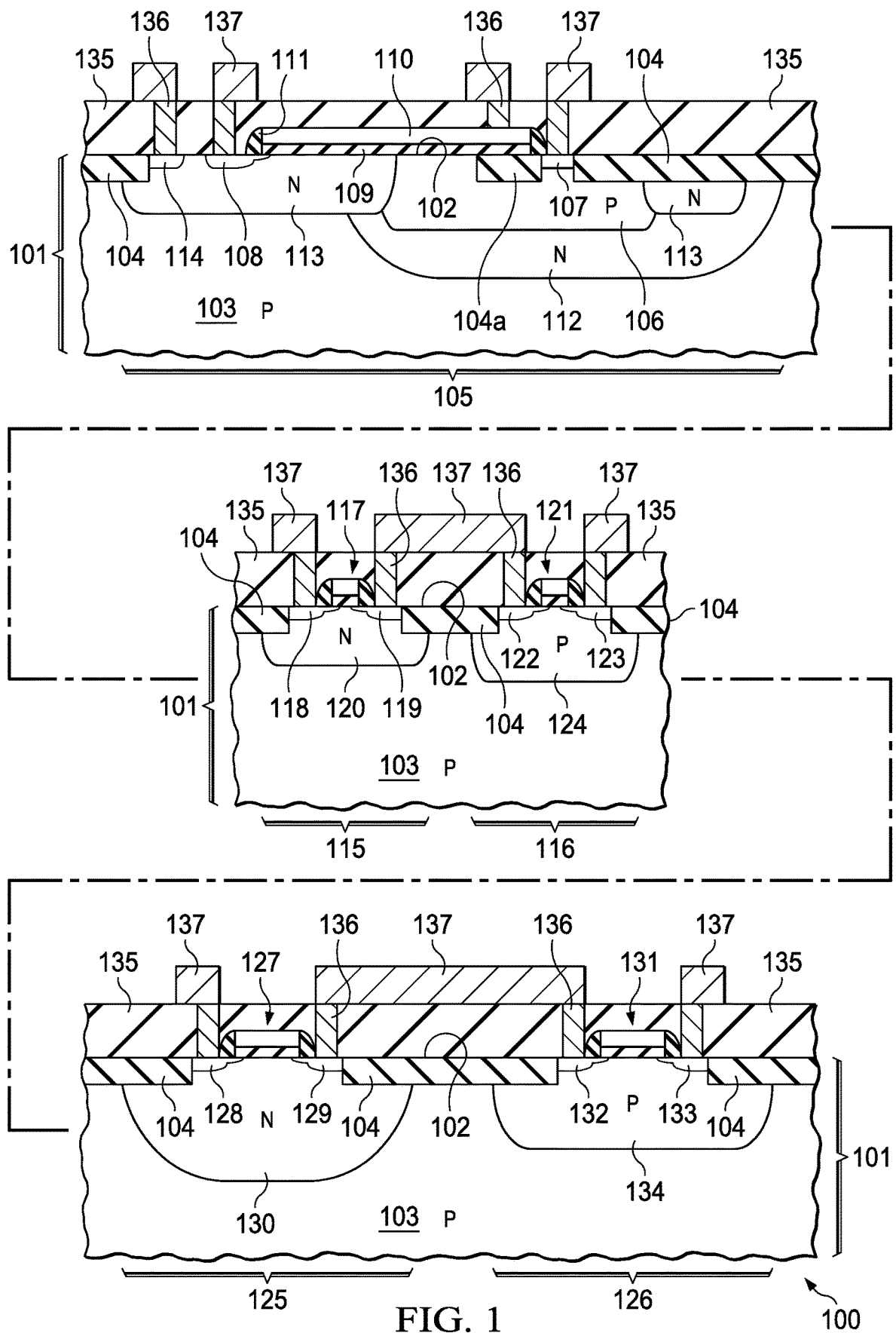
FIG. 1 is a cross section of an example integrated circuit which includes an extended drain MOS transistor with dual well isolation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. It is not intended that the active devices of the present invention be limited to the physical structures illustrated. These structures are included to demonstrate the utility and application of the present invention to presently preferred embodiments.

An integrated circuit has a substrate with a lower layer of a semiconductor material having a first conductivity type. The integrated circuit includes an extended drain metal oxide semiconductor (MOS) transistor located over the lower layer. A drain well of the extended drain MOS transistor has the first conductivity type. The drain well is separated from the lower layer by a drain isolation well which contacts the drain well and contacts the lower layer. The drain isolation well has a second conductivity type, opposite from the first conductivity type. A source region of the extended drain MOS transistor is separated from the lower layer by a body well. The body well contacts the source region and the lower layer. The body well has the second conductivity type. An average dopant density of the second conductivity type in the drain isolation well is less than an average dopant density of the second conductivity type in the body well.

Terms such as top, over, above, under, and below may be used in this disclosure. These terms should not be construed as limiting the position or orientation of a structure or element, but should be used to provide spatial relationship between structures or elements.

The term "substantially equal" as used in this disclosure refers in one aspect to quantities, such as average dopant densities, which are equal within fabrication tolerances encountered during fabrication of the integrated circuit. In another aspect, the term "substantially equal" as used in this disclosure refers to measurements of quantities, such as average dopant densities, which are equal within measurement tolerances encountered during measurement of the quantities.

FIG. 1 is a cross section of an example integrated circuit which includes an extended drain MOS transistor with dual well isolation. The integrated circuit 100 has a substrate 101 which has a top surface 102 and which includes a lower layer 103 of a semiconductor material having a first conductivity type. In this example, the first conductivity type is p-type, as indicated in FIG. 1. The substrate 101 may further include a field oxide layer 104 extending to the top surface 102. The field oxide layer 104 may laterally separate components and elements in the integrated circuit 100. For the purposes of this disclosure, the terms "lateral" and "laterally" are understood to refer to a direction parallel to a plane of the top surface 102. Similarly, the terms "vertical" and "vertically" are understood to refer to a direction perpendicular to the plane of the top surface 102. The terms lateral, laterally, vertical, and vertically are similarly understood in subsequent examples. The field oxide layer 104 may have a shallow trench isolation (STI) structure, wherein the field oxide layer 104 extends below the top surface 102 to a depth of 250 nanometers to 750 nanometers, with substantially straight sidewalls, and does not extend above the top surface 102 more than 100 nanometers, as depicted in FIG. 1.

The integrated circuit 100 includes the extended drain MOS transistor 105, which has a first polarity. In this example, the first polarity is p-channel. The extended drain MOS transistor 105 includes a drain well 106 having the first conductivity type, located in the substrate 101; in this example, the drain well 106 is p-type. The drain well 106 may have an average dopant density of the first conductivity type of $10^{16}$ cm$^{-3}$ to $10^{18}$ cm$^{-3}$, for example, to enable operation of the extended drain MOS transistor 105 at a desired voltage. For the purposes of this disclosure, the terms "dopant concentration of the first conductivity type" and "dopants of the first conductivity type" refer to dopants which provide the first conductivity type. For a case in which the first conductivity type is p-type, as in this example, boron, gallium, and indium are dopants of the first conductivity type, as they provide p-type conductivity. For a case in which the first conductivity type is n-type, phosphorus, arsenic, and antimony are dopants of the first conductivity type, as they provide n-type conductivity. The extended drain MOS transistor 105 may optionally include a drain contact region 107 contacting the drain well 106 and extending to the top surface 102. The drain contact region 107 has the first conductivity type, with an average dopant density of the first conductivity type of $10^{19}$ cm$^{-3}$ to $10^{21}$ cm$^{-3}$, for example, to provide a desired low resistance connection to the drain well 106.

The extended drain MOS transistor 105 includes a source region 108 having the first conductivity type, located in the substrate 101; in this example, the source region 108 is p-type. The source region 108 and the drain contact region 107 may have substantially equal average densities of the dopants of the first conductivity type. The extended drain MOS transistor 105 includes a gate dielectric layer 109 on the top surface 102 of the substrate 101, and a gate 110 on the gate dielectric layer 109. The gate dielectric layer 109 may include silicon dioxide, nitrided silicon dioxide, hafnium oxide, zirconium oxide, or other dielectric material suitable for a MOS transistor. The gate dielectric layer 109 may have a thickness appropriate for a desired gate-drain potential during operation of the integrated circuit 100. The extended drain MOS transistor 105 may operate at a gate-drain potential of 8 volts to 100 volts, for example. The gate dielectric layer 109 may have a thickness of 3 nanometers to 10 nanometers, for example. The gate 110 may include, for example, polycrystalline silicon, titanium nitride, tantalum nitride, or metal silicide. The gate 110 extends from the source region 108 to the drain well 106, overlapping a portion of the drain well 106. In this example, the extended drain MOS transistor 105 may include an element of the field oxide layer 104a between the drain contact region 107 and the portion of the drain well 106 that is overlapped by the gate 110. The drain well 106 extends under the element of the field oxide layer 104a, as depicted in FIG. 1. This drain configuration may advantageously enable a reduced area of the extended drain MOS transistor 105 by providing a voltage drop across the portion of the drain well 106 under the element of the field oxide layer 104a. The extended drain MOS transistor 105 may include gate sidewall spacers 111 on lateral surfaces of the gate 110. The gate sidewall spacers 111 may include silicon nitride, silicon dioxide, or silicon oxynitride, for example.

The drain well 106 is vertically separated from the lower layer 103 by a drain isolation well 112 located in the substrate 101 and having a second conductivity type, opposite from the first conductivity type. The drain isolation well 112 contacts the lower layer 103 and the drain well 106. In this example, the drain isolation well 112 is n-type, as indicated in FIG. 1. The drain isolation well 112 may have an average dopant density of the second conductivity type of $10^{15}$ cm$^{-3}$ to $10^{17}$ cm$^{-3}$, for example, to provide a desired junction capacitance at a junction between the drain isolation well 112 and the drain well 106, and to provide a desired breakdown potential between the drain isolation well 112 and the drain well 106. For the purposes of this disclosure, the terms "dopant concentration of the second conductivity type" and "dopants of the second conductivity type" refer to dopants which provide the second conductivity type. The dopant concentration of the second conductivity type in the drain isolation well 112 may decrease with a vertical distance below the top surface 102, and may decrease with a lateral distance from the drain contact region 107, which may enable the desired junction capacitance and desired breakdown potential to be attained by appropriate placement of the junction between the drain isolation well 112 and the drain well 106.

The source region 108 is vertically separated from the lower layer 103 by a body well 113 located in the substrate 101 and having the second conductivity type. The body well 113 contacts the lower layer 103 and the source region 108. In this example, the body well 113 is n-type, as indicated in FIG. 1. The body well 113 may have an average dopant density of the second conductivity type of $10^{16}$ cm$^{-3}$ to $10^{18}$ cm$^{-3}$, for example, to provide a desired threshold potential for the extended drain MOS transistor 105. The average dopant density of the second conductivity type of the drain isolation well 112 is less than the average dopant density of the second conductivity type of the body well 113. In this example, the body well 113 may contact the drain well 106 under the gate 110, as depicted in FIG. 1, which may advantageously reduce an area of the extended drain MOS transistor 105. The body well 113 may optionally extend laterally around the drain well 106, as indicated in FIG. 1. The configuration of the extended drain MOS transistor 105, having the drain well 106 isolated from the lower layer 103 by the drain isolation well 112, and having the source region 108 isolated from the lower layer 103 by the body well 113, in which both the drain isolation well 112 and the body well 113 contact the lower layer 103, may advantageously reduce an area of the extended drain MOS transistor 105 by eliminating a need for a single isolation structure extending completely under the extended drain MOS transistor 105. The extended drain MOS transistor 105 may optionally include a body contact region 114 contacting the body well 113 and extending to the top surface 102. The body contact region 114 has the second conductivity type, with an average dopant density of the second conductivity type of $10^{19}$ cm$^{-3}$ to $10^{21}$ cm$^{-3}$, for example, to provide a desired low resistance connection to the body well 113.

The extended drain MOS transistor 105 is depicted in FIG. 1 with an asymmetric configuration, in which the source region 108 is located on one side of the drain well 106. In an alternate version of this example, the extended drain MOS transistor 105 may have a symmetric configuration, in which the source region 108 is located on opposite sides of the drain well 106.

The integrated circuit 100 may optionally include a first low voltage MOS transistor 115 having the first polarity, and a second low voltage MOS transistor 116 having a second polarity, opposite from the first polarity. In this example, the first low voltage MOS transistor 115 is p-channel, and the second low voltage MOS transistor 116 is n-channel. For the purposes of this disclosure, the term "low voltage" as applied to MOS transistors refers to MOS transistors that are operated at drain-source potentials less than 3 volts. Such transistors are commonly used in logic circuits and static random access memory (SRAM) circuits. The first low voltage MOS transistor 115 has a first low voltage gate structure 117 on the top surface 102 of the substrate 101, a first source 118 in the substrate 101, and a first drain 119 in the substrate 101. The first low voltage MOS transistor 115 is disposed in a first well 120. The first well 120 has the second conductivity type, which is n-type in this example, as indicated in FIG. 1. The first well 120 may have an average dopant density of the second conductivity type substantially equal to that of the body well 113.

The second low voltage MOS transistor 116 has a second low voltage gate structure 121 on the top surface 102 of the substrate 101, a second source 122 in the substrate 101, and a second drain 123 in the substrate 101. The second low voltage MOS transistor 116 is disposed in a second well 124. The second well 124 has the first conductivity type, p-type in this example, as indicated in FIG. 1. The second well 124 may have an average dopant density of the first conductivity type substantially equal to that of the drain well 106. In the semiconductor industry, a well having the same conductivity type as the substrate is sometimes referred to as merely the substrate and not a well at all. As used herein, however, the term "well" is intended to mean either an n-type well or a p-type well, and includes a well that may have the same conductivity type as the substrate.

The integrated circuit 100 may optionally include a first high voltage MOS transistor 125 having the first polarity, which is p-channel in this example, and a second high voltage MOS transistor 126 having the second polarity, which is n-channel in this example. For the purposes of this disclosure, the term "high voltage" as applied to MOS transistors refers to MOS transistors that are operated at drain-source potentials of 3 volts to 6 volts. Such transistors are commonly used in input/output circuits and analog circuits. The first high voltage MOS transistor 125 has a first high voltage gate structure 127 on the top surface 102 of the substrate 101, a third source 128 in the substrate 101, and a third drain 129 in the substrate 101. The first high voltage MOS transistor 125 is disposed in a third well 130. The third well 130 has the second conductivity type, which is n-type in this example, as indicated in FIG. 1. The third well 130 may have an average dopant density of the second conductivity type substantially equal to that of the drain isolation well 112.

The second high voltage MOS transistor 126 has a second high voltage gate structure 131 on the top surface 102 of the substrate 101, a fourth source 132 in the substrate 101, and a fourth drain 133 in the substrate 101. The second high voltage MOS transistor 126 is disposed in a fourth well 134. The fourth well 134 has the first conductivity type, which is p-type in this example, as indicated in FIG. 1.

The integrated circuit 100 may include a dielectric layer 135 over the top surface 102 of the substrate 101. The dielectric layer 135 may be manifested as a pre-metal dielectric (PMD) layer having one or more sub-layers, for example a PMD liner of silicon nitride on the top surface 102, a layer of silicon dioxide, phosphosilicate glass (PSG), or borophosphosilicate glass (BPSG), and a cap layer of silicon nitride, silicon oxynitride, silicon carbide or silicon carbide nitride. The integrated circuit 100 may also include contacts 136 extending through the dielectric layer 135 to provide electrical connections to the extended drain MOS transistor 105, the first low voltage MOS transistor 115, the second low voltage MOS transistor 116, the first high voltage MOS transistor 125, and the second high voltage MOS transistor 126. The contacts 136 may include liners of titanium and titanium nitride or tantalum nitride, with cores of tungsten. The integrated circuit 100 may further include interconnects 137 on the dielectric layer 135, making electrical connections to the contacts 136. The interconnects may include aluminum or copper, for example.

Figure 2A:
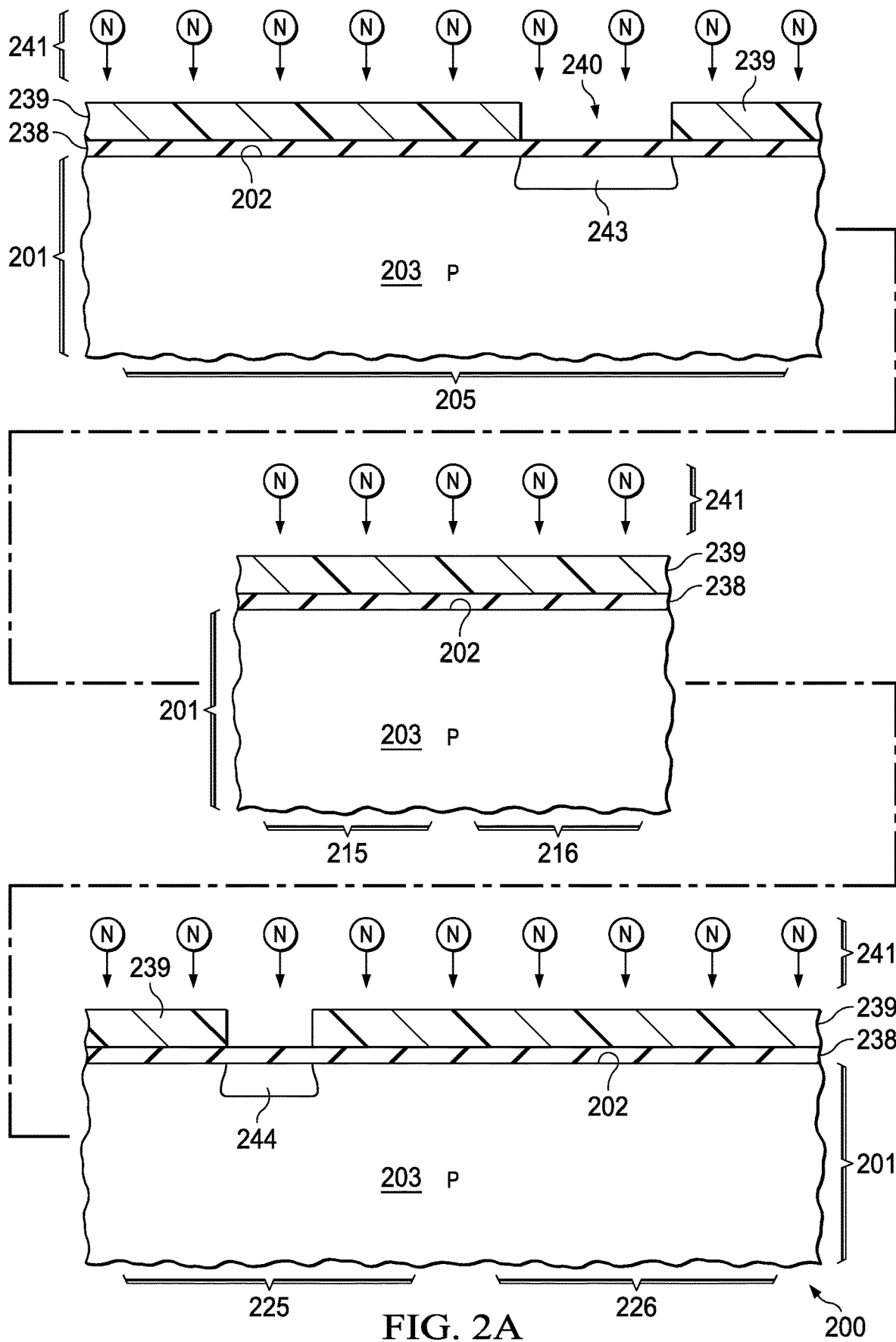
FIG. 2A through FIG. 2D are cross sections of an integrated circuit which includes an extended drain MOS transistor with dual well isolation, depicted in stages of an example method of formation.

FIG. 2A through FIG. 2D are cross sections of an integrated circuit which includes an extended drain MOS transistor with dual well isolation, depicted in stages of an example method of formation. Referring to FIG. 2A, formation of the integrated circuit 200 includes acquiring a substrate 201. The substrate 201 may be implemented as a bulk semiconductor wafer, a semiconductor wafer with an epitaxial layer, a silicon-on-insulator (SOI) wafer, or other structure suitable for forming the integrated circuit 200. The substrate 201 has a top surface 202, and includes a lower layer 203 of a semiconductor material having a first conductivity type, below the top surface 202. In this example, the first conductivity type is p-type, as indicated in FIG. 2A.

The substrate 201 includes an area for the extended drain MOS transistor 205, an area for a first low voltage MOS transistor 215, an area for a second low voltage MOS transistor 216, an area for a first high voltage MOS transistor 225, and an area for a second high voltage MOS transistor 226. The terms "low voltage" and "high voltage" are used as described in reference to FIG. 1.

A protective layer 238 may be formed on the top surface 202. The protective layer 238 may include silicon dioxide, formed by a thermal oxidation process. The protective layer 238 may have a thickness of 5 nanometers to 25 nanometers, by way of example. The protective layer 238 is sometimes referred to as a pad layer or a pad oxide layer. The protective layer 238 may advantageously reduce contamination of the substrate 201 during subsequent fabrication operations. Other compositions and methods of formation for the protective layer 238 are within the scope of this example.

A first implant mask 239 is formed over the protective layer 238. The first implant mask 239 exposes the protective layer 238 in an area 240 for a subsequently-formed drain isolation well 212, shown in FIG. 2B, in the area for the extended drain MOS transistor 205. In this example, the area 240 may have a lateral dimension in a direction parallel to the plane of FIG. 2A that is less than half of a lateral dimension of the subsequently-formed drain isolation well 212 in the same direction. The first implant mask 239 may optionally expose an area for a subsequently-formed third well 230, shown in FIG. 2B, in the area for the first high voltage MOS transistor 225. The first implant mask 239 may be formed of photoresist using a photolithographic process. Alternatively, the first implant mask 239 may be formed of hard mask materials such as silicon oxynitride. Other materials and processes for forming the first implant mask 239 are within the scope of this example.

First dopants 241 are implanted into the substrate 201 in the areas exposed by the first implant mask 239, to form a drain isolation implanted region 243 in the area for the extended drain MOS transistor 205, and to form a well implanted region 244 in the area for the first high voltage MOS transistor 225. The first dopants 241 are dopants of the second conductivity type, which, in this example, are n-type dopants such as phosphorus. The first dopants 241 may be implanted at a dose of $10^{12}$ cm$^{-2}$ to $10^{14}$ cm$^{-2}$, to provide a desired average dopant density of the second conductivity type in the subsequently-formed drain isolation well 212 and the subsequently-formed third well 230. The first dopants 241 may be implanted at an energy sufficient to place a major portion of the first dopants 241 through the protective layer 238 and into the substrate 201. For example, the first dopants 241 may be implanted at an energy of 20 kiloelectron volts (keV) to 100 keV.

The first implant mask 239 is removed after the first dopants 241 are implanted. The first implant mask 239 may be removed by a plasma etch process, followed by a wet etch cleanup process.

Figure 2B:
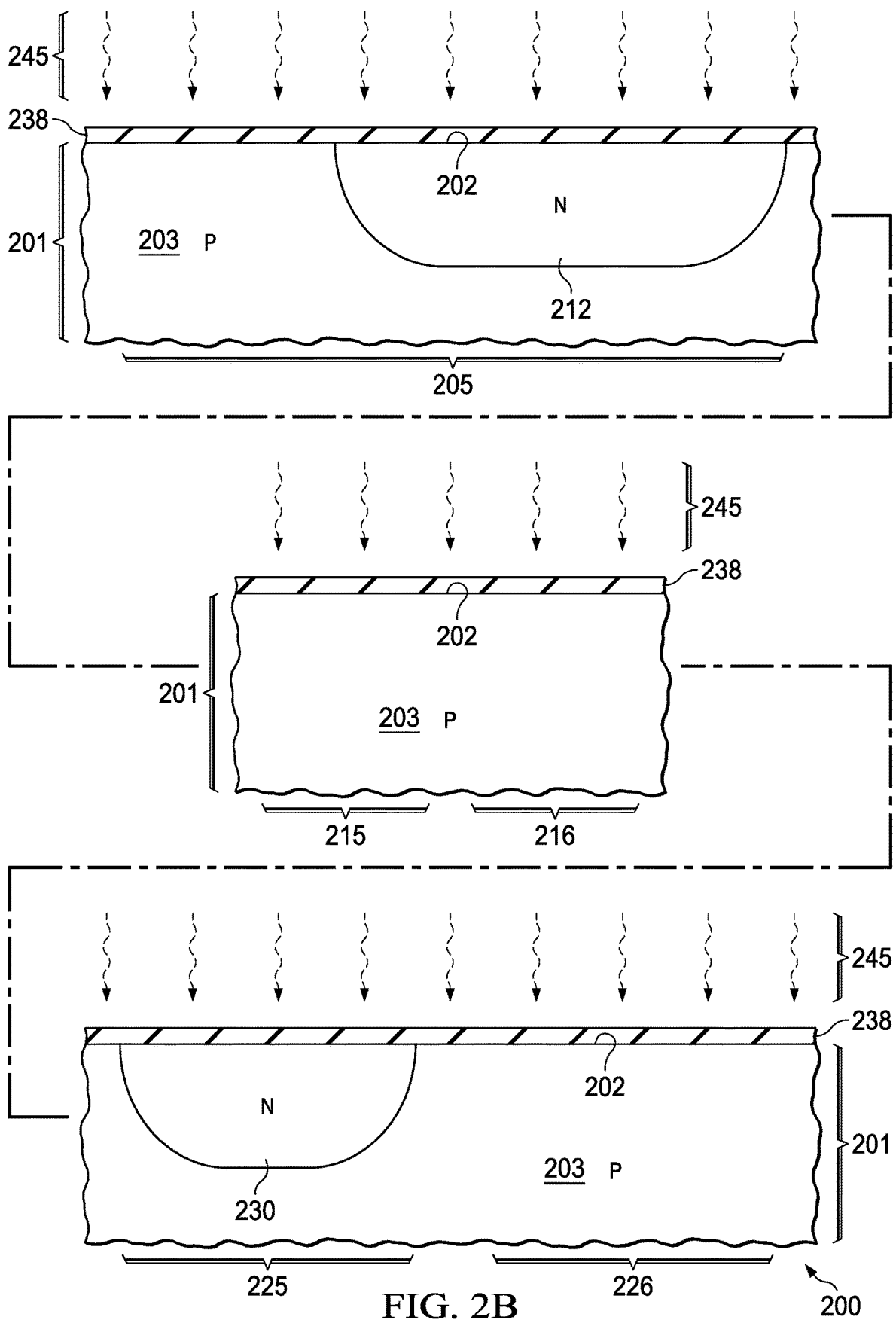

Referring to FIG. 2B, the substrate 201 is heated by a thermal process 245 to diffuse and activate the first dopants 241 of FIG. 2A in the drain isolation implanted region 243 and the well implanted region 244 of FIG. 2A, to form the drain isolation well 212 and the third well 230, respectively. The thermal process 245 may have a thermal profile sufficient to diffuse the first dopants 241 so that a lateral dimension of the drain isolation well 212 in a direction parallel to the plane of FIG. 2B is more than twice a lateral dimension of the area 240 exposed by the first implant mask 230 of FIG. 2A, in the same direction. By way of example, the thermal process 245 may heat the substrate 201 to 1080° C. to 1120° C. for 300 minutes to 400 minutes. The thermal process 245 may be implemented as a furnace process using an ambient including some oxygen, to grow additional silicon dioxide on the top surface 202 of the substrate 201. A density of the first dopants 241 in the drain isolation well 212 may be lower at a junction between the drain isolation well 212 and the lower layer 203 than in a region encompassing the drain isolation implanted region 243, as a result of the thermal process 245.

Figure 2C:
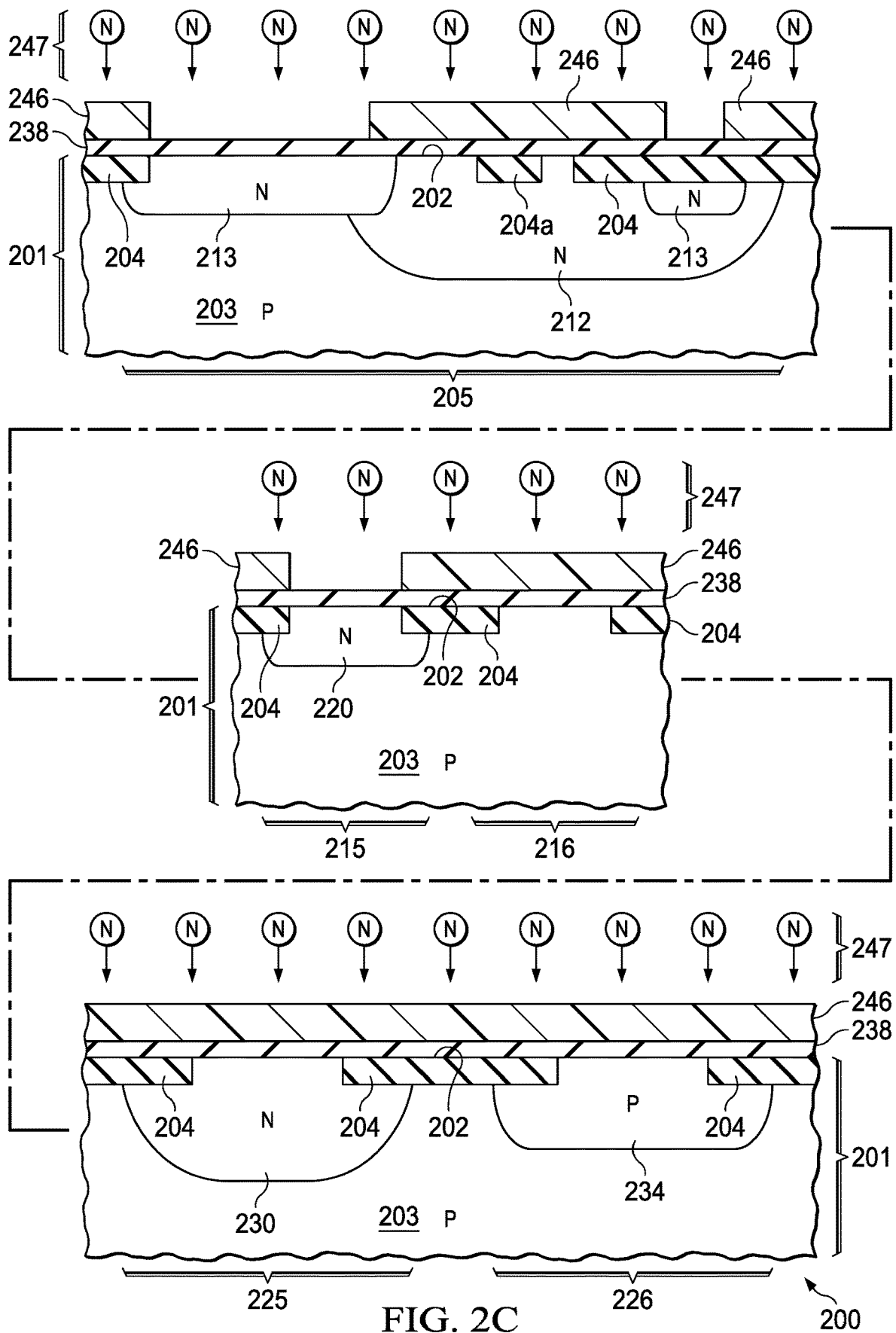

Referring to FIG. 2C, a field oxide layer 204 is formed which extends into the substrate 201. The field oxide layer 204 may be formed by an STI process, so that the field oxide layer 204 has the STI structure depicted in FIG. 2C. An example STI process includes forming a chemical mechanical polish (CMP) stop layer of silicon nitride over the substrate 201, etching isolation trenches through the CMP stop layer and into the substrate 201, and filling the isolation trenches with silicon dioxide using a plasma enhanced chemical vapor deposition (PECVD) process using tetraethyl orthosilicate (TEOS), a high density plasma (HDP) process, a high aspect ratio process (HARP) using TEOS and ozone, an atmospheric chemical vapor deposition (APCVD) process using silane, or a subatmospheric chemical vapor deposition (SACVD) process using dichlorosilane. Excess silicon dioxide is removed from over the CMP stop layer by an oxide CMP process, and the CMP stop layer is subsequently removed, leaving the field oxide layer 204. In this example, an element of the field oxide layer 204a may be formed in the drain isolation well 212.

A fourth well 234 may be formed in the area for the second high voltage MOS transistor 226. The fourth well 234 has the first conductivity type, which is p-type in this example, as indicated in FIG. 2C.

A second implant mask 246 is formed over the protective layer 238. The second implant mask 246 exposes the protective layer 238 in an area for a subsequently-formed body well 213 in the area for the extended drain MOS transistor 205. The second implant mask 246 may optionally expose an area for a subsequently-formed first well 220 in the area for the first low voltage MOS transistor 215. The second implant mask 246 may include photoresist or hard mask materials, for example, and may be formed by a similar process as the first implant mask 239 of FIG. 2A.

Second dopants 247 are implanted into the substrate 201 in the areas exposed by the second implant mask 246. The second dopants 247 are dopants of the second conductivity type, which, in this example, are n-type dopants such as phosphorus and arsenic. The second dopants 247 may be implanted in more than one implant step, with a main step having a dose of $10^{12}$ cm$^{-2}$ to $10^{14}$ cm$^{-2}$ of phosphorus, implanted at an energy of 400 keV to 600 keV. Additional implant steps of the second dopants 247 may have lower doses and lower energies, to set threshold potentials for the extended drain MOS transistor 205 and the first low voltage MOS transistor 215.

The second implant mask 246 is removed after the second dopants 247 are implanted. The second implant mask 246 may be removed by a similar process as that used to remove the first implant mask 239 of FIG. 2A.

The substrate 201 is subsequently heated to activate the second dopants 247 that were implanted into the substrate 201, to form the body well 213 and the first well 220. The substrate 201 may be heated by a rapid thermal process, to reduce unwanted diffusion of the second dopants 247 and the first dopants 241 of FIG. 2A in the drain isolation well 212. For example, the substrate 201 may be heated to 1000° C. to 1100° C. for 20 seconds to 60 seconds. The body well 213 has a higher average dopant density of the second conductivity type than the drain isolation well 212.

Figure 2D:
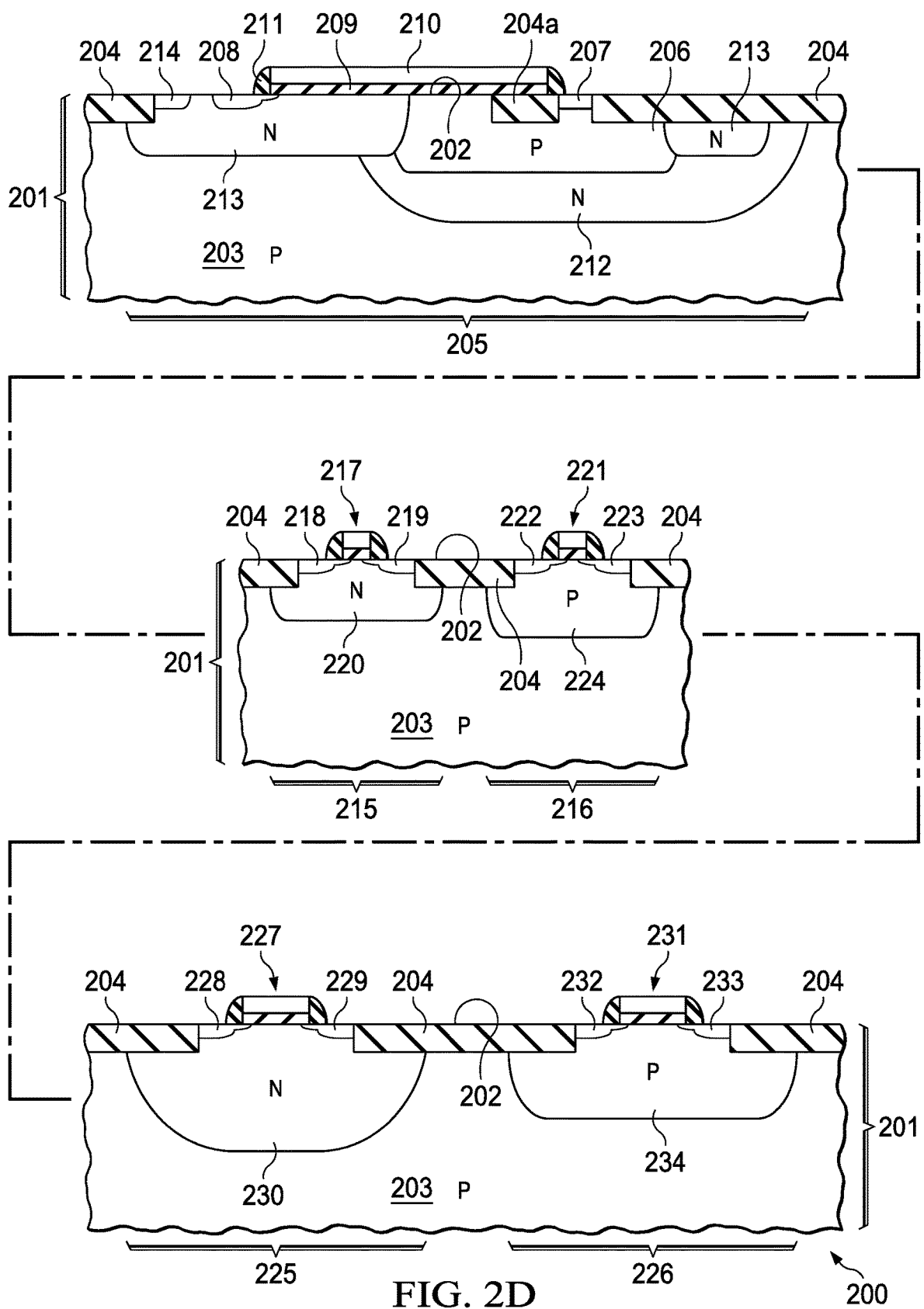

Referring to FIG. 2D, a drain well 206 is formed in the substrate 201 in the area for the extended drain MOS transistor 205, so that the drain well 206 is vertically separated from the lower layer 203 by the drain isolation well 212. The drain well 206 of this example is formed so as to extend under the element of the field oxide layer 204a. The drain well 206 has the first conductivity type; in this example, the drain well 206 is p-type. A second well 224 may be formed in the substrate 201 in the area for the second low voltage MOS transistor 216. The second well 224 has the first conductivity type, and may be formed to have a similar distribution of dopants of the first conductivity type as the drain well 206.

The drain well 206 and the second well 224 may be formed concurrently by implanting dopants of the first conductivity type, such as boron, into the substrate 201 using an appropriate implant mask, not shown in FIG. 2D. The dopants of the first conductivity type may be implanted in more than one implant step, with a main step having a dose of $10^{12}$ cm$^{-2}$ to $10^{14}$ cm$^{-2}$ of boron, implanted at an energy of 200 keV to 400 keV. Additional implant steps of the dopants of the first conductivity type may have lower doses and lower energies, to set a threshold potential for the second low voltage MOS transistor 216. The substrate 201 is subsequently heated to activate the dopants of the first conductivity type that were implanted into the substrate 201, to form the drain well 206 and the second well 224. The substrate 201 may be heated by a similar process as described in reference to FIG. 2C. Forming the drain well 206 and the second well 224 may reduce a fabrication cost of the integrated circuit 200 compared to forming the drain well 206 and the second well 224 separately. In some versions of the example, activating the dopants of the first conductivity type may be done concurrently with activating the second dopants 247 of FIG. 2C.

The protective layer 238 of FIG. 2C is subsequently removed. The protective layer 238 may be removed by a wet etch process using a buffered dilute aqueous solution of hydrofluoric acid, for example.

A gate dielectric layer 209 is formed on the top surface 202 of the substrate 201 in the area for the extended drain MOS transistor 205. The gate dielectric layer 209 may be formed by a thermal oxidation process, or by deposition of oxide material by an atomic layer deposition (ALD) process, for example. A gate 210 of the extended drain MOS transistor 205 is formed on the gate dielectric layer 209. The gate 210 may be formed, for example, by forming a layer of polycrystalline silicon on the gate dielectric layer 209, and then patterning the layer of polycrystalline silicon using an etch mask and a reactive ion etch (ME) process. Gate sidewall spacers 211 may be formed on lateral surfaces of the gate 210. The gate sidewall spacers 211 may be formed by forming one or more conformal layers of silicon nitride, silicon dioxide, or silicon oxynitride, over the gate 210, and removing the one or more conformal layers from horizontal surfaces of the gate 210 and the substrate 201 using an anisotropic etch process, leaving the one or more conformal layers on the lateral surfaces of the gate 210 to provide the gate sidewall spacers 211.

A first low voltage gate structure 217 is formed on the top surface 202 of the substrate 201 in the area for the first low voltage MOS transistor 215. A second low voltage gate structure 221 is formed on the top surface 202 of the substrate 201 in the area for the second low voltage MOS transistor 216. A first high voltage gate structure 227 is formed on the top surface 202 of the substrate 201 in the area for the first high voltage MOS transistor 225. A second high voltage gate structure 231 is formed on the top surface 202 of the substrate 201 in the area for the second high voltage MOS transistor 226. Portions or all of the first low voltage gate structure 217, the second low voltage gate structure 221, the first high voltage gate structure 227 and the second high voltage gate structure 231 may be formed concurrently with the gate dielectric layer 209, the gate 210, and the gate sidewall spacers 211 of the extended drain MOS transistor 205.

A source region 208 is formed in the substrate 201, contacting the body well 213 adjacent to the gate 210, and located opposite from the drain well 206. The source region 208 has the first conductivity type; in this example, the source region 208 is p-type. The source region 208 may be formed by implanting dopants of the first conductivity type, such as boron, in two or more implant steps. A first portion of the source region 208 may be formed by implanting a first portion of the dopants of the first conductivity type before the gate sidewall spacers 211 are formed, and a second portion of the source region 208 may be formed implanting a second portion of the dopants of the first conductivity type after the gate sidewall spacers 211 are formed. A total dose of the dopants of the first conductivity type may be $1\times10^{14}$ $cm^{-2}$ to $1\times10^{16}$ $cm^{-2}$, for example. The substrate 201 is subsequently heated to activate the dopants of the first conductivity type that were implanted into the substrate 201, to form the source region 208. The substrate 201 may be heated by a spike anneal process, to reduce unwanted diffusion of dopants already activated in the substrate 201. For example, the substrate 201 may be heated to 950° C. to 1100° C. for 1 second to 10 seconds.

A drain contact region 207 may optionally be formed in the substrate 201, contacting the drain well 206. The drain contact region 207 has the first conductivity type; in this example, the drain contact region 207 is p-type. The drain contact region 207 may be formed concurrently with the source region 208.

A first source 218 and a first drain 219 are formed in the substrate 201 in the area for the first low voltage MOS transistor 215, on opposite sides of the first low voltage gate structure 217. A third source 228 and a third drain 229 are formed in the substrate 201 in the area for the first high voltage MOS transistor 225, on opposite sides of the first high voltage gate structure 227. The first source 218, the first drain 219, the third source 228, and the third drain 229 have the first conductivity type; in this example, the first source 218, the first drain 219, the third source 228, and the third drain 229 are p-type. The first source 218, the first drain 219, the third source 228, and the third drain 229 may be formed concurrently with the source region 208.

A body contact region 214 may optionally be formed in the substrate 201, contacting the body well 213. The body contact region 214 has the second conductivity type; in this example, the body contact region 214 is n-type. The body contact region 214 may be formed by implanting dopants of the second conductivity type, such as phosphorus, arsenic, and antimony, into the substrate 201, optionally in two or more implant steps. A total dose of the dopants of the second conductivity type may be $1\times10^{14}$ $cm^{-2}$ to $1\times10^{16}$ $cm^{-2}$, for example. The substrate 201 is subsequently heated to activate the dopants of the second conductivity type that were implanted into the substrate 201, to form the body contact region 214. The substrate 201 may be heated by a spike anneal process, to reduce unwanted diffusion of dopants already activated in the substrate 201. For example, the substrate 201 may be heated to 950° C. to 1100° C. for 1 second to 10 seconds.

A second source 222 and a second drain 223 are formed in the substrate 201 in the area for the second low voltage MOS transistor 216, on opposite sides of the second low voltage gate structure 221. A fourth source 232 and a fourth drain 233 are formed in the substrate 201 in the area for the second high voltage MOS transistor 226, on opposite sides of the second high voltage gate structure 231. The second source 222, the second drain 223, the fourth source 232, and the fourth drain 233 have the second conductivity type; in this example, the second source 222, the second drain 223, the fourth source 232, and the fourth drain 233 are n-type. The second source 222, the second drain 223, the fourth source 232, and the fourth drain 233 may be formed concurrently with the body contact region 214.

Formation of the integrated circuit 200 may be continued by forming a dielectric layer, not shown in FIG. 2D, over the top surface 202 of the substrate 201, similar to the dielectric layer 135 of FIG. 1. Contacts, not shown in FIG. 2D, may be formed through the dielectric layer, similar to the contacts 136 of FIG. 1. Interconnects, not shown in FIG. 2D, may be formed on the dielectric layer, making electrical connections to the contacts, similar to the interconnects 137 of FIG. 1.

Figure 3:
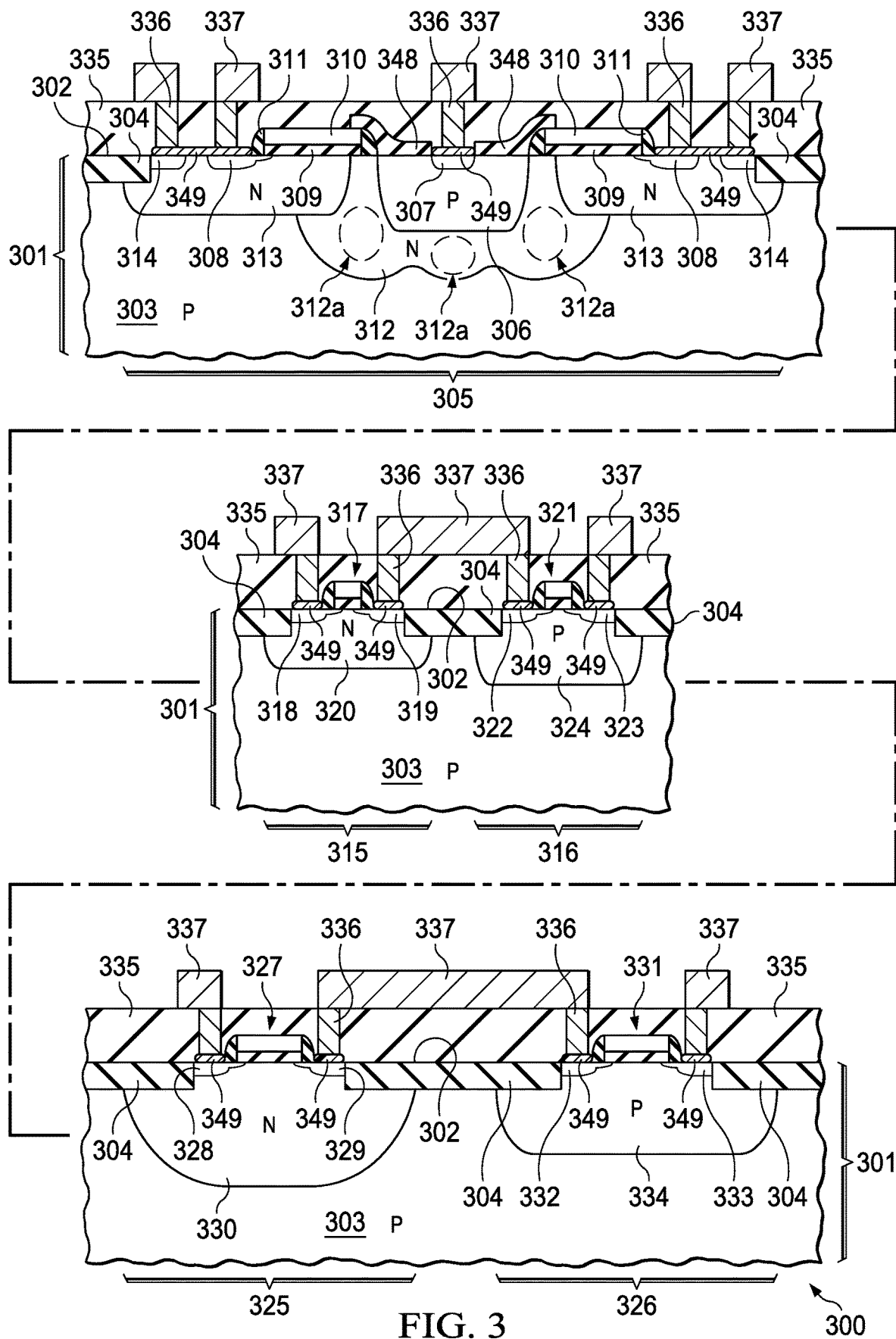
FIG. 3 is a cross section of another example integrated circuit which includes an extended drain MOS transistor with dual well isolation.

FIG. 3 is a cross section of another example integrated circuit which includes an extended drain MOS transistor with dual well isolation. The integrated circuit 300 has a substrate 301 which has a top surface 302 and which includes a lower layer 303 of a semiconductor material having a first conductivity type. In this example, the first conductivity type is p-type, as indicated in FIG. 3. The substrate 301 may further include a field oxide layer 304 extending to the top surface 302. The field oxide layer 304 may have an STI structure, as depicted in FIG. 3.

The integrated circuit 300 includes the extended drain MOS transistor 305, which has a first polarity, which, in this example, is p-channel. The extended drain MOS transistor 305 includes a drain well 306 having the first conductivity type, located in the substrate 301; in this example, the drain well 306 is p-type. The drain well 306 may have an average dopant density of the first conductivity type as disclosed in reference to the drain well 106 of FIG. 1. The extended drain MOS transistor 305 may optionally include a drain contact region 307 contacting the drain well 306 and extending to the top surface 302. The drain contact region 307 has the first conductivity type, with an average dopant density of the first conductivity type as disclosed in reference to the drain contact region 107 of FIG. 1.

The extended drain MOS transistor 305 includes a source region 308 having the first conductivity type, located in the substrate 301; in this example, the source region 308 is p-type. In this example, the source region 308 is arranged symmetrically on opposite sides of the drain well 306, as depicted in FIG. 3. The source region 308 and the drain contact region 307 may have similar average densities of the dopants of the first conductivity type. The extended drain MOS transistor 305 includes a gate dielectric layer 309 on the top surface 302 of the substrate 301, and a gate 310 on the gate dielectric layer 309. In this example, the gate 310 and the gate dielectric layer 309 are arranged symmetrically on opposite sides of the drain well 306, as depicted in FIG. 3. The gate 310 and the gate dielectric layer 309 may include the materials disclosed in reference to the gate 110 and the gate dielectric layer 109 of FIG. 1. The gate 310 extends from the source region 308 towards the drain well 306; in this example, the gate 310 does not overlap a portion of the drain well 306. The extended drain MOS transistor 305 may include gate sidewall spacers 311 on lateral surfaces of the gate 310. A silicide block layer 348 is disposed over the top surface 302 of the substrate 301, extending from the gate 310 to the drain contact region 307. The silicide block layer 348 may include one or more layers of silicon dioxide, silicon nitride, silicon oxynitride, or other material suitable for preventing formation of metal silicide on the top surface 302. In some versions of this example, the silicide block layer 348 may be manifested as an extension of the gate sidewall spacers 311.

The drain well 306 is vertically separated from the lower layer 303 by a drain isolation well 312 located in the substrate 301 and having a second conductivity type, opposite from the first conductivity type. In this example, the drain isolation well 312 is n-type, as indicated in FIG. 3. The drain isolation well 312 contacts the lower layer 303 and the drain well 306. The drain isolation well 312 may have an average dopant density of the second conductivity type of $10^{15}$ cm$^{-3}$ to $10^{17}$ cm$^{-3}$, for example. The drain isolation well 312 may laterally surround the drain well 306, as depicted in FIG. 3, as well as extending completely under the drain well 306. In this example, the drain isolation well 312 may have two or more regions 312a of higher dopant density of the second conductivity type, laterally adjacent to each other, wherein the drain isolation well between the regions 312a have a lower dopant density of the second conductivity type than the regions 312a. The regions 312a of higher dopant density may provide a more uniform distribution of the dopants of the second conductivity type, which may advantageously enable attainment of a desired junction capacitance and a desired breakdown potential of the drain well 306 around a lateral perimeter of the drain well 306, compared to the laterally decreasing dopant concentration of the drain isolation well 112 of FIG. 1.

The source region 308 is vertically separated from the lower layer 303 by a body well 313 located in the substrate 301 and having the second conductivity type. In this example, the body well 313 is n-type, as indicated in FIG. 3. The body well 313 contacts the lower layer 303 and the source region 308. The body well 313 may have an average dopant density of the second conductivity type of $10^{16}$ cm$^{-3}$ to $10^{18}$ cm$^{-3}$, for example. The average dopant density of the second conductivity type of the drain isolation well 312 is less than the average dopant density of the second conductivity type of the body well 313. In this example, the body well 313 may be separated from the drain well 306 under the gate 310 by the drain isolation well 312, as depicted in FIG. 3, which may advantageously enable operation of the extended drain MOS transistor 305 at a higher potential than a similar transistor in which the body well contacts the drain well. The configuration of the extended drain MOS transistor 305, having the drain well 306 isolated from the lower layer 303 by the drain isolation well 312, and having the source region 308 isolated from the lower layer 303 by the body well 313, in which both the drain isolation well 312 and the body well 313 contact the lower layer 303, may advantageously reduce an area of the extended drain MOS transistor 305 by eliminating a need for a single isolation structure extending completely under the extended drain MOS transistor 305. The extended drain MOS transistor 305 may optionally include body contact regions 314 contacting the body well 313 and extending to the top surface 302. The body contact regions 314 have the second conductivity type, with an average dopant density of the second conductivity type of $10^{19}$ cm$^{-3}$ to $10^{21}$ cm$^{-3}$, for example, to provide a desired low resistance connection to the body well 313.

The extended drain MOS transistor 305 is depicted in FIG. 3 with a symmetric configuration, in which the source region 308 is located on both sides of the drain well 306. In an alternate version of this example, the extended drain MOS transistor 305 may have an asymmetric configuration, in which the source region 308 is located on one side of the drain well 306.

In this example, metal silicide 349 is disposed on the drain contact region 307, on the source region 308, and on the body contact regions 314. The metal silicide 349 may advantageously provide a reduced electrical resistance connection to the drain contact region 307, the source region 308, and the body contact regions 314. The top surface 302 between the drain contact region 307 and the gate 310 is free of the metal silicide 349, due to the presence of the silicide block layer 348. The metal silicide 349 may include, for example, titanium silicide, cobalt silicide, nickel silicide, platinum silicide, or tungsten silicide.

The integrated circuit 300 may optionally include a first low voltage MOS transistor 315 having the first polarity, p-channel in this example. The first low voltage MOS transistor 315 has a first low voltage gate structure 317 on the top surface 302 of the substrate 301, a first source 318 in the substrate 301, and a first drain 319 in the substrate 301, with the metal silicide 349 on the first source 318 and the first drain 319. The first low voltage MOS transistor 315 is disposed in a first well 320, which has the second conductivity type, n-type in this example, as indicated in FIG. 3.

The first well 320 may have an average dopant density of the second conductivity type substantially equal to that of the body well 313.

The integrated circuit 300 may optionally also include a second low voltage MOS transistor 316 having a second polarity, n-channel in this example. The second low voltage MOS transistor 316 has a second low voltage gate structure 321 on the top surface 302 of the substrate 301, a second source 322 in the substrate 301, and a second drain 323 in the substrate 301, with the metal silicide 349 on the second source 322 and the second drain 323. The second low voltage MOS transistor 316 is disposed in a second well 324, which has the first conductivity type, which is p-type in this example, as indicated in FIG. 3. The second well 324 may have an average dopant density of the first conductivity type substantially equal to that of the drain well 306.

The integrated circuit 300 may optionally include a first high voltage MOS transistor 325 having the first polarity, p-channel in this example. The first high voltage MOS transistor 325 has a first high voltage gate structure 327 on the top surface 302 of the substrate 301, a third source 328 in the substrate 301, and a third drain 329 in the substrate 301, with the metal silicide 349 on the third source 328 and the third drain 329. The first high voltage MOS transistor 325 is disposed in a third well 330, which has the second conductivity type, n-type in this example, as indicated in FIG. 3. The third well 330 may have an average dopant density of the second conductivity type substantially equal to that of the drain isolation well 312.

The integrated circuit 300 may also optionally include a second high voltage MOS transistor 326 having the second polarity, n-channel in this example. The second high voltage MOS transistor 326 has a second high voltage gate structure 331 on the top surface 302 of the substrate 301, a fourth source 332 in the substrate 301, and a fourth drain 333 in the substrate 301, with the metal silicide 349 on the fourth source 332 and the fourth drain 333. The second high voltage MOS transistor 326 is disposed in a fourth well 334, which has the first conductivity type, p-type in this example, as indicated in FIG. 3.

The integrated circuit 300 may include a dielectric layer 335 over the top surface 302 of the substrate 301. The dielectric layer 335 may be manifested as a PMD layer similar to the PMD layer disclosed in reference to FIG. 1. The integrated circuit 300 may also include contacts 336 extending through the dielectric layer 335 to the metal silicide 349, to provide electrical connections to the extended drain MOS transistor 305, the first low voltage MOS transistor 315, the second low voltage MOS transistor 316, the first high voltage MOS transistor 325, and the second high voltage MOS transistor 326. The contacts 336 may have the structures disclosed in reference to the contacts 136 of FIG. 1. The integrated circuit 300 may further include interconnects 337 on the dielectric layer 335, making electrical connections to the contacts 336.

Figure 4A:
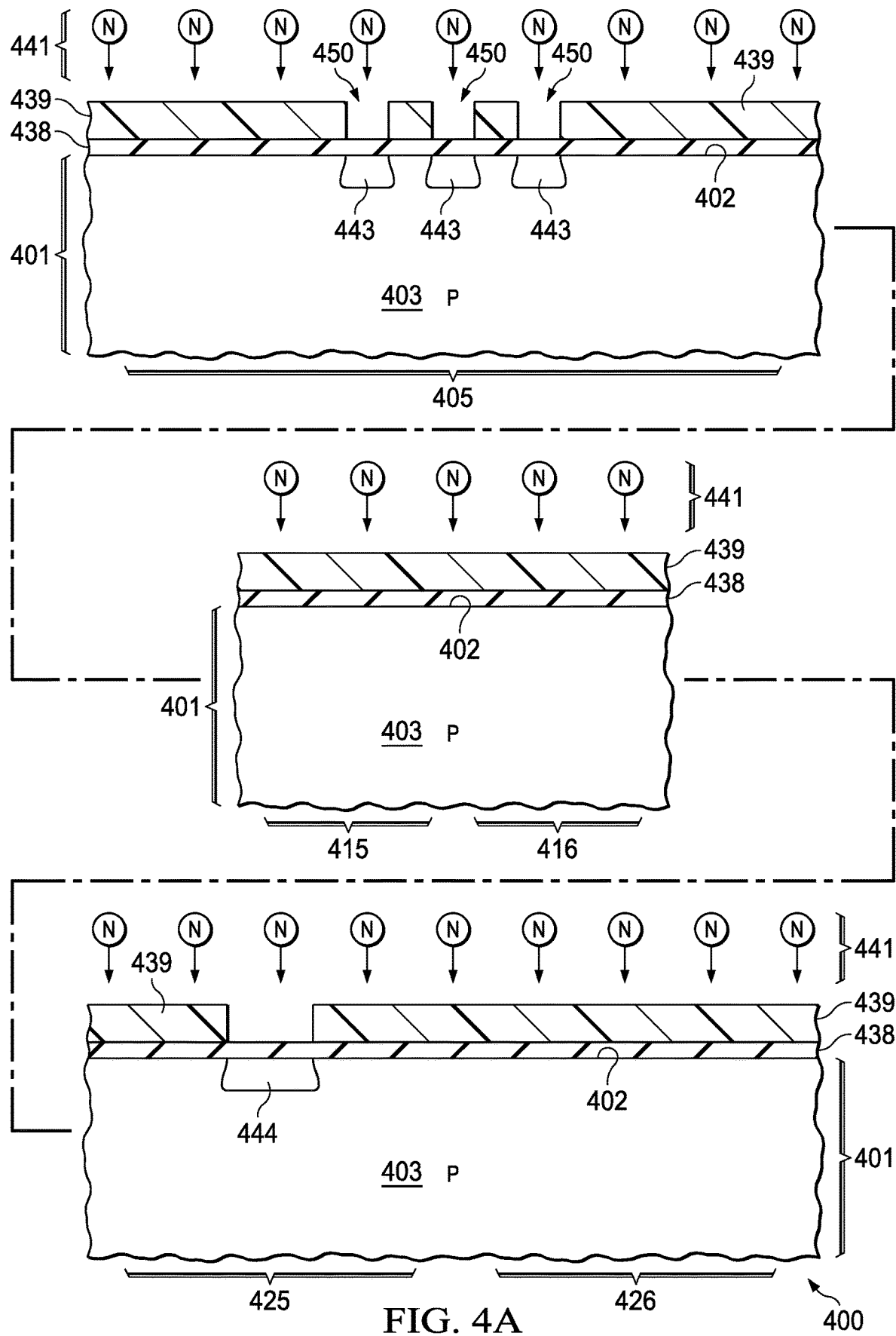
FIG. 4A through FIG. 4D are cross sections of an integrated circuit which includes an extended drain MOS transistor with dual well isolation, depicted in stages of another example method of formation.

FIG. 4A through FIG. 4D are cross sections of an integrated circuit which includes an extended drain MOS transistor with dual well isolation, depicted in stages of another example method of formation. Referring to FIG. 4A, formation of the integrated circuit 400 includes acquiring a substrate 401, which may be implemented as disclosed in reference to the substrate 201 of FIG. 2A. The substrate 401 has a top surface 402, and includes a lower layer 403 of a semiconductor material, below the top surface 402. The lower layer 403 has a first conductivity type, p-type in this example, as indicated in FIG. 4A.

The substrate 401 includes an area for the extended drain MOS transistor 405, an area for a first low voltage MOS transistor 415, an area for a second low voltage MOS transistor 416, an area for a first high voltage MOS transistor 425, and an area for a second high voltage MOS transistor 426. The terms "low voltage" and "high voltage" are used as described in reference to FIG. 1.

A protective layer 438 may be formed on the top surface 402. The protective layer 438 may have a composition and structure as described in reference to the protective layer 238 of FIG. 2A. A first implant mask 439 is formed over the protective layer 438. The first implant mask 439 exposes the protective layer 438 in an area for a subsequently-formed drain isolation well 412, shown in FIG. 4B, in the area for the extended drain MOS transistor 405. In this example, the first implant mask 439 exposes the protective layer 438 in a plurality of sub-areas 450 in the area for the extended drain MOS transistor 405. The sub-areas 450 may be separate from each other, or may be connected out of the plane of FIG. 2A. The first implant mask 439 may optionally expose an area for a subsequently-formed third well 430, shown in FIG. 4B, in the area for the first high voltage MOS transistor 425. The first implant mask 439 may be formed as disclosed in reference to the first implant mask 239 of FIG. 2A.

First dopants 441 are implanted into the substrate 401 in the areas exposed by the first implant mask 439, to form a plurality of drain isolation implanted regions 443 in the area for the extended drain MOS transistor 405, and to form a well implanted region 444 in the area for the first high voltage MOS transistor 425. In this example, the drain isolation implanted regions 443 correspond to the sub-areas 450 exposed by the first implant mask 439, as depicted in FIG. 4A. The first dopants 441 are dopants of the second conductivity type, in this example, n-type dopants such as phosphorus. The first dopants 441 may be implanted at a dose of $10^{12}$ cm$^{-2}$ to $10^{14}$ cm$^{-2}$, to provide a desired average dopant density of the second conductivity type in the subsequently-formed drain isolation well 412 and the subsequently-formed third well 430. Having the plurality of drain isolation implanted regions 443 may provide a first average dose of the first dopants 441 in the drain isolation implanted region 443, and may provide a second average dose of the first dopants 441 in the well implanted region 444 in the area for the first high voltage MOS transistor 425, in which the first desired average dose of the first dopants 441 in the drain isolation implanted region 443 is lower than the second average dose of the first dopants 441 in the well implanted region 444. The first dopants 441 may be implanted at an energy sufficient to place a major portion of the first dopants 441 through the protective layer 438 and into the substrate 401. The first implant mask 439 is removed after the first dopants 441 are implanted.

Figure 4B:
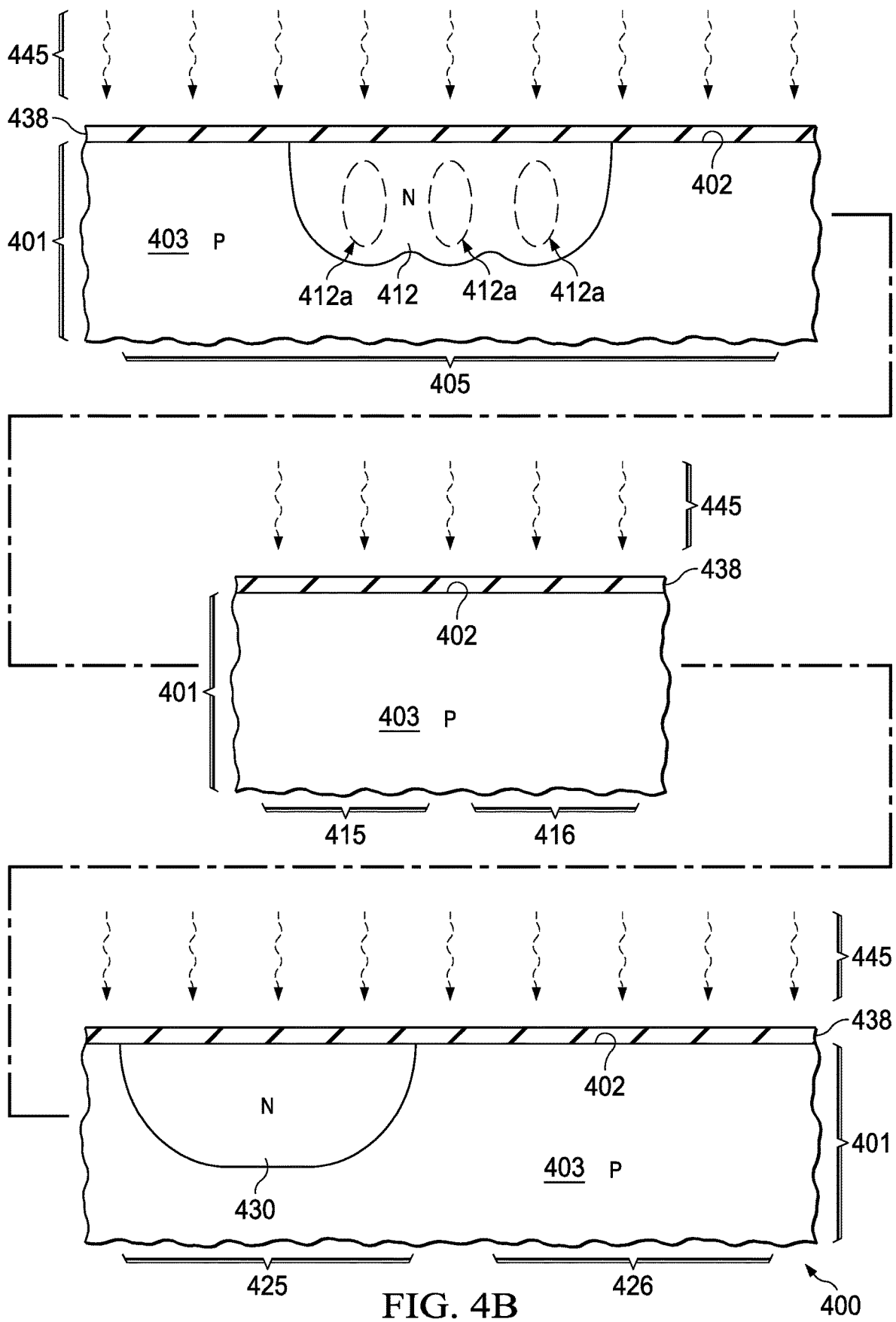

Referring to FIG. 4B, the substrate 401 is heated by a thermal process 445 to diffuse and activate the first dopants 441 of FIG. 4A in the drain isolation implanted regions 443 and the well implanted region 444 of FIG. 4A, to form the drain isolation well 412 and the third well 430, respectively. The thermal process 445 may have a thermal profile sufficient to diffuse the first dopants 441 sufficiently to form a drain isolation well 412 that is continuous across the drain isolation implanted regions. Having the plurality of the drain isolation implanted regions 443 may result in a plurality of regions 412a of higher dopant density of the second conductivity type, laterally adjacent to each other, in the drain isolation well 412, with each region 412a corresponding to a drain isolation implanted region 443. By way of example, the thermal process 445 may heat the substrate 401 to 1080°

C. to 1120° C. for 300 minutes to 400 minutes. The thermal process 445 may be implemented as disclosed in reference to FIG. 2B. An average density of the first dopants 441 in the drain isolation well 412 may be lower than an average density of the first dopants 441 in the third well 430.

Figure 4C:
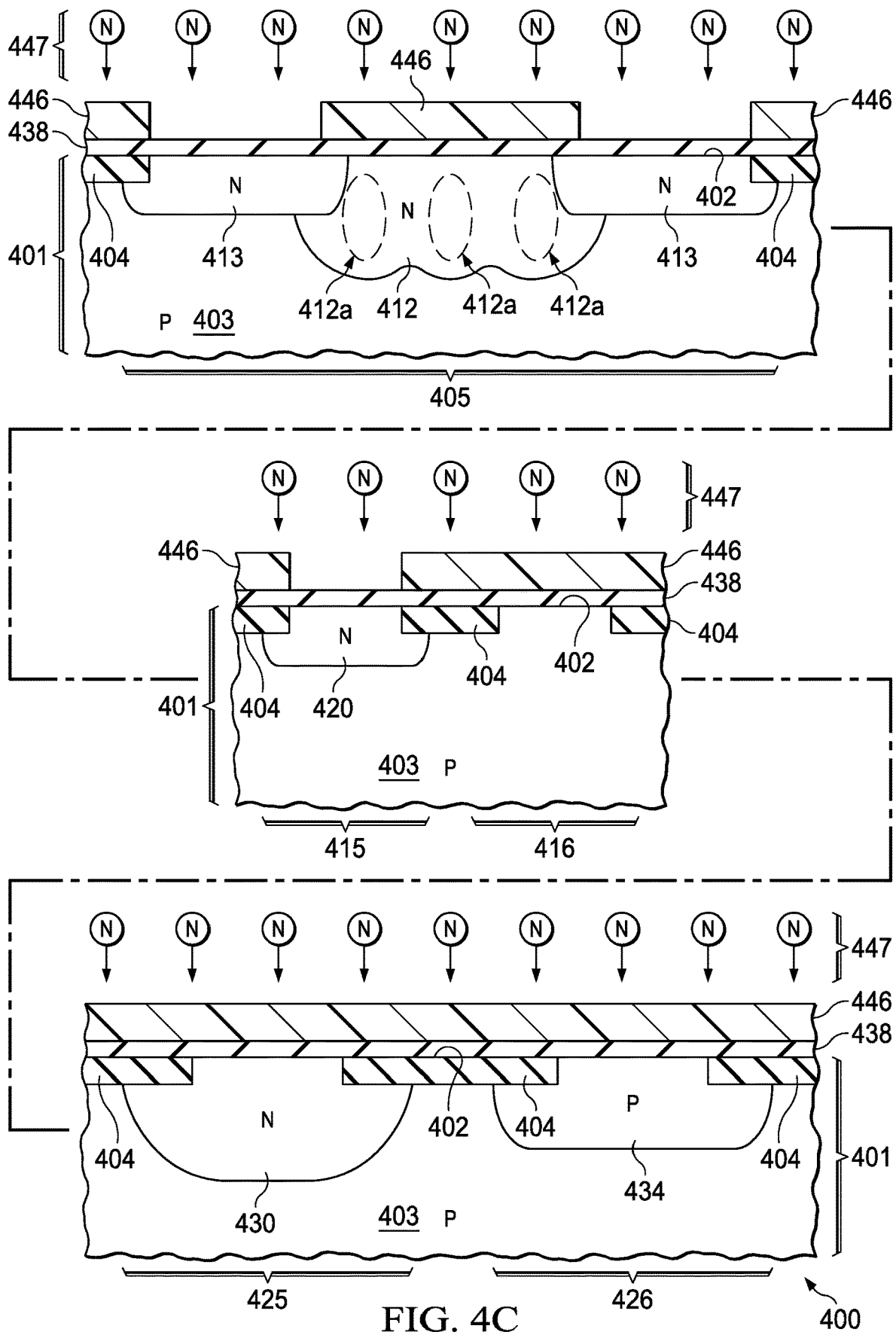

Referring to FIG. 4C, a field oxide layer 404 is formed which extends into the substrate 401. The field oxide layer 404 may be formed by an STI process, so that the field oxide layer 404 has the STI structure depicted in FIG. 4C. A fourth well 434 may be formed in the area for the second high voltage MOS transistor 426. The fourth well 434 has the first conductivity type, p-type in this example, as indicated in FIG. 4C.

A second implant mask 446 is formed over the protective layer 438. The second implant mask 446 exposes the protective layer 438 in an area for a subsequently-formed body well 413 in the area for the extended drain MOS transistor 405. The second implant mask 446 may optionally expose an area for a subsequently-formed first well 420 in the area for the first low voltage MOS transistor 415. The second implant mask 446 may be formed by a similar process as the first implant mask 439 of FIG. 4A. Second dopants 447 are implanted into the substrate 401 in the areas exposed by the second implant mask 446. The second dopants 447 are dopants of the second conductivity type, n-type dopants such as phosphorus and arsenic, in this example. The second dopants 447 may be implanted in more than one implant step, with a main step having a dose of $10^{12}$ cm$^{-2}$ to $10^{14}$ cm$^{-2}$ of phosphorus, implanted at an energy of 400 keV to 600 keV. Additional implant steps of the second dopants 447 may have lower doses and lower energies, to set threshold potentials for the extended drain MOS transistor 405 and the first low voltage MOS transistor 415. The second implant mask 446 is removed after the second dopants 447 are implanted. The second implant mask 446 may be removed by a similar process as that used to remove the first implant mask 439 of FIG. 4A.

The substrate 401 is subsequently heated to activate the second dopants 447 that were implanted into the substrate 401, to form the body well 413 and the first well 420. The substrate 401 may be heated by a rapid thermal process, to reduce unwanted diffusion of the second dopants 447 and the first dopants 441 of FIG. 4A in the drain isolation well 412. The body well 413 has a higher average dopant density of the second conductivity type than the drain isolation well 412.

Figure 4D:
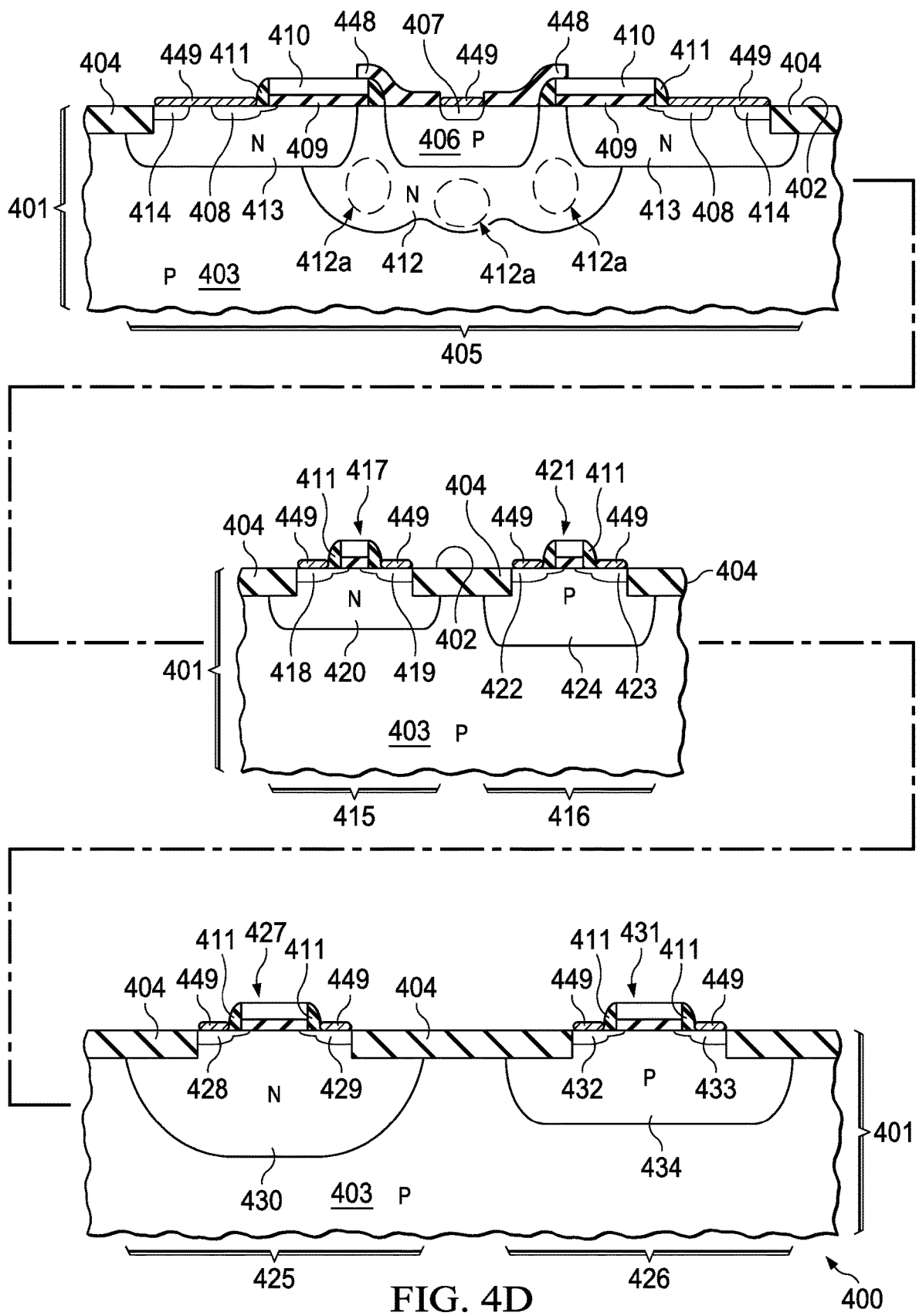

Referring to FIG. 4D, a drain well 406 is formed in the substrate 401 in the area for the extended drain MOS transistor 405, so that the drain well 406 is vertically separated from the lower layer 403 by the drain isolation well 412. The drain well 406 has the first conductivity type; p-type in this example. A second well 424 may be formed in the substrate 401 in the area for the second low voltage MOS transistor 416. The second well 424 has the first conductivity type, and may be formed to have a similar distribution of dopants of the first conductivity type as the drain well 406. The drain well 406 and the second well 424 may be formed concurrently as disclosed in reference to the drain well 206 and the second well 224 of FIG. 2D, accruing a similar advantage of fabrication cost reduction. The protective layer 438 of FIG. 4C is subsequently removed.

A gate dielectric layer 409 is formed on the top surface 402 of the substrate 401 in the area for the extended drain MOS transistor 405. A gate 410 of the extended drain MOS transistor 405 is formed on the gate dielectric layer 409. The gate 410 and the gate dielectric layer 409 may be formed as disclosed in reference to the gate 210 and the gate dielectric layer 209 of FIG. 2D. Gate sidewall spacers 411 may be formed on lateral surfaces of the gate 410. The gate sidewall spacers 411 may be formed as disclosed in reference to the gate sidewall spacers 211 of FIG. 2D. A silicide block layer 448 is formed over the top surface 402 of the substrate 401, extending from the gate 410 to the drain contact region 407. The silicide block layer 448 may be formed by forming one or more layers of silicon dioxide, silicon nitride, or silicon nitride over the gate 410 and over the top surface 402 of the substrate 401, followed by patterning the one or more layers using a plasma etch process to remove the one or more layers where exposed by an etch mask, not shown in FIG. 4D. Alternatively, the silicide block layer 448 may be formed by patterning the conformal layers used to form the gate sidewall spacers 411, so that the silicide block layer 448 is implemented as an extension of the gate sidewall spacers 411.

A first low voltage gate structure 417 is formed on the top surface 402 of the substrate 401 in the area for the first low voltage MOS transistor 415. A second low voltage gate structure 421 is formed on the top surface 402 of the substrate 401 in the area for the second low voltage MOS transistor 416. A first high voltage gate structure 427 is formed on the top surface 402 of the substrate 401 in the area for the first high voltage MOS transistor 425. A second high voltage gate structure 431 is formed on the top surface 402 of the substrate 401 in the area for the second high voltage MOS transistor 426. Portions or all of the first low voltage gate structure 417, the second low voltage gate structure 421, the first high voltage gate structure 427 and the second high voltage gate structure 431 may be formed concurrently with the gate dielectric layer 409, the gate 410, and the gate sidewall spacers 411 of the extended drain MOS transistor 405.

A source region 408 is formed in the substrate 401, contacting the body well 413 adjacent to the gate 410, and located opposite from the drain well 406. The source region 408 has the first conductivity type; in this example, the source region 408 is p-type. The source region 408 may be formed as disclosed in reference to the source region 208 of FIG. 2D. A drain contact region 407 may optionally be formed in the substrate 401, contacting the drain well 406. The drain contact region 407 has the first conductivity type; in this example, the drain contact region 407 is p-type. The drain contact region 407 may be formed concurrently with the source region 408. A first source 418 and a first drain 419 are formed in the substrate 401 in the area for the first low voltage MOS transistor 415, on opposite sides of the first low voltage gate structure 417. A third source 428 and a third drain 429 are formed in the substrate 401 in the area for the first high voltage MOS transistor 425, on opposite sides of the first high voltage gate structure 427. The first source 418, the first drain 419, the third source 428, and the third drain 429 have the first conductivity type; in this example, the first source 418, the first drain 419, the third source 428, and the third drain 429 are p-type. The first source 418, the first drain 419, the third source 428, and the third drain 429 may be formed concurrently with the source region 408.

A body contact region 414 may optionally be formed in the substrate 401, contacting the body well 413. The body contact region 414 has the second conductivity type; in this example, the body contact region 414 is n-type. The body contact region 414 may be formed as disclosed in reference to the body contact region 214 of FIG. 2D. A second source 422 and a second drain 423 are formed in the substrate 401 in the area for the second low voltage MOS transistor 416, on opposite sides of the second low voltage gate structure 421. A fourth source 432 and a fourth drain 433 are formed in the substrate 401 in the area for the second high voltage MOS transistor 426, on opposite sides of the second high voltage gate structure 431. The second source 422, the second drain 423, the fourth source 432, and the fourth drain 433 have the second conductivity type; in this example, the second source 422, the second drain 423, the fourth source 432, and the fourth drain 433 are n-type. The second source 422, the second drain 423, the fourth source 432, and the fourth drain 433 may be formed concurrently with the body contact region 414.

Metal silicide 449 is formed on the drain contact region 407, on the source region 408, on the body contact region 414, on the first source 418, on the first drain 419, on the second source 422, on the second drain 423, on the third source 428, on the third drain 429, on the fourth source 432, and on the fourth drain 433. An example process for forming the metal silicide 449 may include forming a metal layer, not shown in FIG. 4D, including titanium, nickel with a few percent platinum, cobalt, or platinum on the top surface 402 of the substrate 401, so that the metal contacts exposed silicon on the drain contact region 407, the source region 408, the body contact region 414, the first source 418, the first drain 419, the second source 422, the second drain 423, the third source 428, the third drain 429, the fourth source 432, and the fourth drain 433. A cap layer of titanium nitride may be formed over the metal layer to provide a diffusion barrier. The metal layer is subsequently heated, for example in a rapid thermal processor, to react the metal layer with the exposed silicon to form the metal silicide 449. Unreacted metal of the metal layer is removed, for example by a wet etch using aqueous solutions of acidic or basic reagents. The metal silicide 449 may be subsequently annealed to provide a desired crystalline phase.

Formation of the integrated circuit 400 may be continued by forming a dielectric layer, not shown in FIG. 4D, over the top surface 402 of the substrate 401, similar to the dielectric layer 335 of FIG. 3. Contacts, not shown in FIG. 4D, may be formed through the dielectric layer, similar to the contacts 336 of FIG. 3. Interconnects, not shown in FIG. 4D, may be formed on the dielectric layer, making electrical connections to the contacts, similar to the interconnects 337 of FIG. 3.

Figure 5:
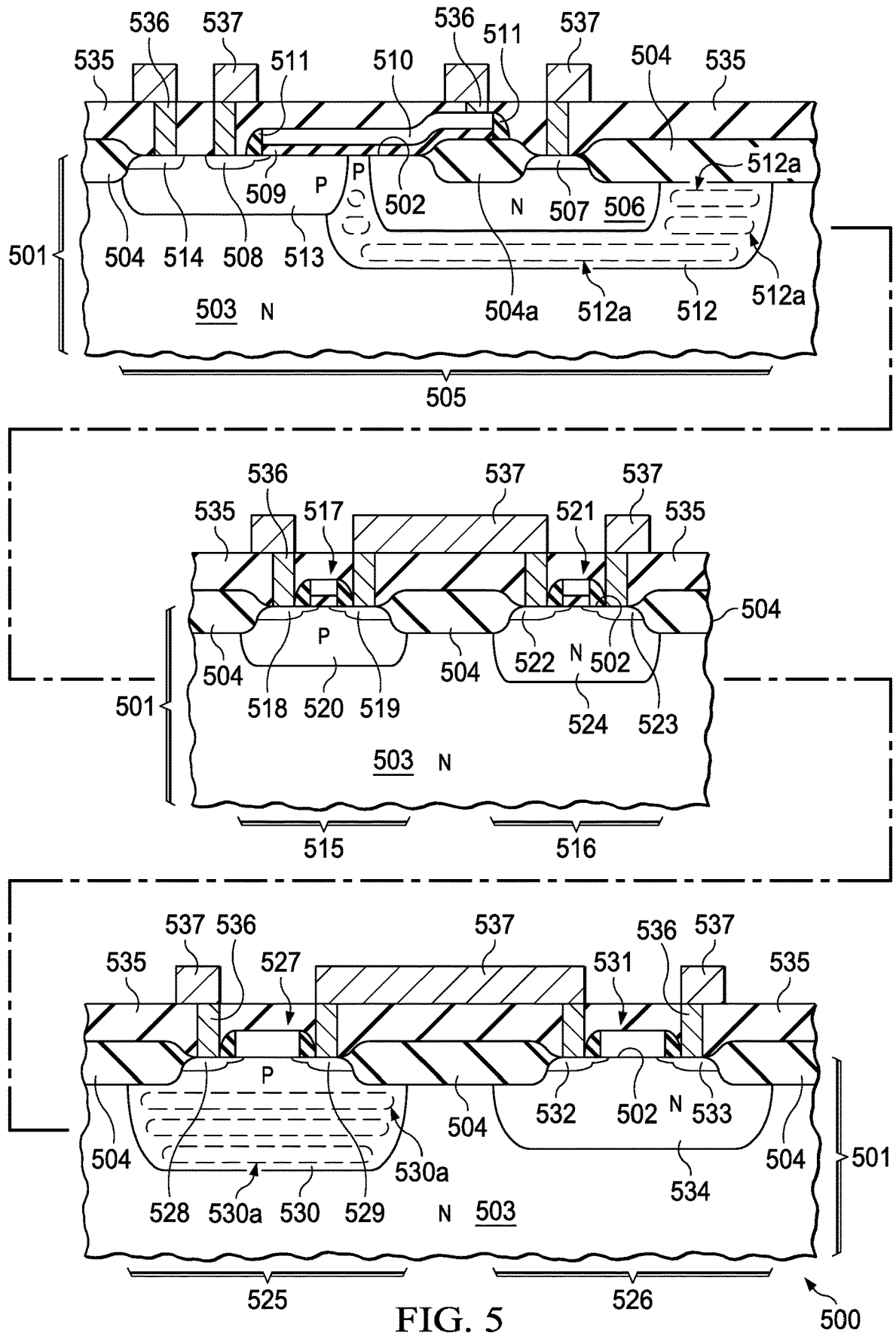
FIG. 5 is a cross section of a further example integrated circuit which includes an extended drain MOS transistor with dual well isolation.

FIG. 5 is a cross section of a further example integrated circuit which includes an extended drain MOS transistor with dual well isolation. The integrated circuit 500 has a substrate 501 which has a top surface 502, and which includes a lower layer 503 of a semiconductor material having a first conductivity type. In this example, the first conductivity type is n-type, as indicated in FIG. 5. The substrate 501 may further include a field oxide layer 504 extending to the top surface 502. The field oxide layer 504 may have a local oxidation of silicon (LOCOS) structure, wherein the field oxide layer 504 extends below the top surface 502 to a depth of 250 nanometers to 750 nanometers, and above the top surface 502 to a height of 150 nanometers to 500 nanometers, with tapered ends, sometimes referred to as birds' beaks, as depicted in FIG. 5.

The integrated circuit 500 includes the extended drain MOS transistor 505, which has a first polarity, n-channel in this example. The extended drain MOS transistor 505 includes a drain well 506 having the first conductivity type, n-type in this example, located in the substrate 501. The drain well 506 may have an average dopant density of the first conductivity type as disclosed in reference to the drain well 106 of FIG. 1. The extended drain MOS transistor 505 may optionally include a drain contact region 507 contacting the drain well 506 and extending to the top surface 502 of the substrate 501. The drain contact region 507 has the first conductivity type, and may have an average dopant density of the first conductivity type as disclosed in reference to the drain contact region 107 of FIG. 1.

The extended drain MOS transistor 505 includes a source region 508 having the first conductivity type, located in the substrate 501; in this example, the source region 508 is n-type. The source region 508 and the drain contact region 507 may have similar average densities of the dopants of the first conductivity type. The extended drain MOS transistor 505 includes a gate dielectric layer 509 on the top surface 502 of the substrate 501, and a gate 510 on the gate dielectric layer 509. The gate 510 and the gate dielectric layer 509 may the materials disclosed in reference to the gate 110 and the gate dielectric layer 109 of FIG. 1. The gate 510 extends from the source region 508 towards the drain well 506; in this example, the gate 510 overlaps a portion of the drain well 506. In this example, the extended drain MOS transistor 505 may include an element of the field oxide layer 504a between the drain contact region 507 and the portion of the drain well 506 that is overlapped by the gate 510. The drain well 506 extends under the element of the field oxide layer 504a, as depicted in FIG. 5. The extended drain MOS transistor 505 may include gate sidewall spacers 511 on lateral surfaces of the gate 510.

The drain well 506 is vertically separated from the lower layer 503 by a drain isolation well 512 located in the substrate 501 and having a second conductivity type, opposite from the first conductivity type. In this example, the drain isolation well 512 is p-type, as indicated in FIG. 5. The drain isolation well 512 contacts the lower layer 503 and the drain well 506. The drain isolation well 512 may have an average dopant density of the second conductivity type of $10^{15}$ cm$^{-3}$ to $10^{17}$ cm$^{-3}$, for example. The drain isolation well 512 may laterally surround the drain well 506, as indicated in FIG. 5, as well as extending completely under the drain well 506. In this example, the drain isolation well 512 may have two or more regions 512a of higher dopant density of the second conductivity type, vertically adjacent to each other. The regions 512a of higher dopant density may provide a more uniform vertical distribution of the dopants of the second conductivity type, which may advantageously enable attainment of a desired junction capacitance and a desired breakdown potential of the drain well 506 around a lateral perimeter of the drain well 506, compared to the vertically decreasing dopant concentration of the drain isolation well 112 of FIG. 1.

The source region 508 is vertically separated from the lower layer 503 by a body well 513 located in the substrate 501 and having the second conductivity type. In this example, the body well 513 is p-type, as indicated in FIG. 5. The body well 513 contacts the lower layer 503 and the source region 508. The body well 513 may have an average dopant density of the second conductivity type of $10^{16}$ cm$^{-3}$ to $10^{18}$ cm$^{-3}$, for example. The average dopant density of the second conductivity type of the drain isolation well 512 is less than the average dopant density of the second conductivity type of the body well 513. In this example, the body well 513 may be separated from the drain well 506 under the gate 510 by the drain isolation well 512, as depicted in FIG. 5. The configuration of the extended drain MOS transistor 505, having the drain well 506 isolated from the lower layer 503 by the drain isolation well 512, and having the source region 508 isolated from the lower layer 503 by the body well 513, in which both the drain isolation well 512 and the body well 513 contact the lower layer 503, may advantageously reduce an area of the extended drain MOS transistor 505 by eliminating a need for a single isolation structure extending completely under the extended drain MOS transistor 505. The extended drain MOS transistor 505 may optionally include body contact regions 514 contacting the body well 513 and extending to the top surface 502 of the substrate 501. The body contact regions 514 have the second conductivity type, with an average dopant density of the second conductivity type of $10^{19}$ cm$^{-3}$ to $10^{21}$ cm$^{-3}$, for example, to provide a desired low resistance connection to the body well 513.

The extended drain MOS transistor 505 is depicted in FIG. 5 with an asymmetric configuration, in which the source region 508 is located on one side of the drain well 506. In an alternate version of this example, the extended drain MOS transistor 505 may have a symmetric configuration, in which the source region 508 is located on opposite sides of the drain well 506.

The integrated circuit 500 may optionally include a first low voltage MOS transistor 515 having the first polarity, n-channel in this example. The first low voltage MOS transistor 515 has a first low voltage gate structure 517 on the top surface 502 of the substrate 501, a first source 518 in the substrate 501, and a first drain 519 in the substrate 501. The first low voltage MOS transistor 515 is disposed in a first well 520, which has the second conductivity type, p-type in this example, as indicated in FIG. 5. The first well 520 may have an average dopant density of the second conductivity type substantially equal to that of the body well 513.

The integrated circuit 500 may optionally also include a second low voltage MOS transistor 516 having a second polarity, p-channel in this example. The second low voltage MOS transistor 516 has a second low voltage gate structure 521 on the top surface 502 of the substrate 501, a second source 522 in the substrate 501, and a second drain 523 in the substrate 501. The second low voltage MOS transistor 516 is disposed in a second well 524, which has the first conductivity type, which is n-type in this example, as indicated in FIG. 5. The second well 524 may have an average dopant density of the first conductivity type substantially equal to that of the drain well 506.

The integrated circuit 500 may optionally include a first high voltage MOS transistor 525 having the first polarity, n-channel in this example. The first high voltage MOS transistor 525 has a first high voltage gate structure 527 on the top surface 502 of the substrate 501, a third source 528 in the substrate 501, and a third drain 529 in the substrate 501. The first high voltage MOS transistor 525 is disposed in a third well 530, which has the second conductivity type, p-type in this example, as indicated in FIG. 5. The third well 530 may have an average dopant density of the second conductivity type substantially equal to that of the drain isolation well 512, and may have two or more regions 530a of higher dopant density of the second conductivity type, vertically adjacent to each other, substantially equal to the drain isolation well 512.

The integrated circuit 500 may also optionally include a second high voltage MOS transistor 526 having the second polarity, p-channel in this example. The second high voltage MOS transistor 526 has a second high voltage gate structure 531 on the top surface 502 of the substrate 501, a fourth source 532 in the substrate 501, and a fourth drain 533 in the substrate 501. The second high voltage MOS transistor 526 is disposed in a fourth well 534, which has the first conductivity type, n-type in this example, as indicated in FIG. 5.

The integrated circuit 500 may include a dielectric layer 535 over the top surface 502 of the substrate 501. The dielectric layer 535 may be manifested as a PMD layer substantially equal to the PMD layer disclosed in reference to FIG. 1. The integrated circuit 500 may also include contacts 536 extending through the dielectric layer 535, to provide electrical connections to the extended drain MOS transistor 505, the first low voltage MOS transistor 515, the second low voltage MOS transistor 516, the first high voltage MOS transistor 525, and the second high voltage MOS transistor 526. The contacts 536 may have the structures disclosed in reference to the contacts 136 of FIG. 1. The integrated circuit 500 may further include interconnects 537 on the dielectric layer 535, making electrical connections to the contacts 536.

Figure 6A:
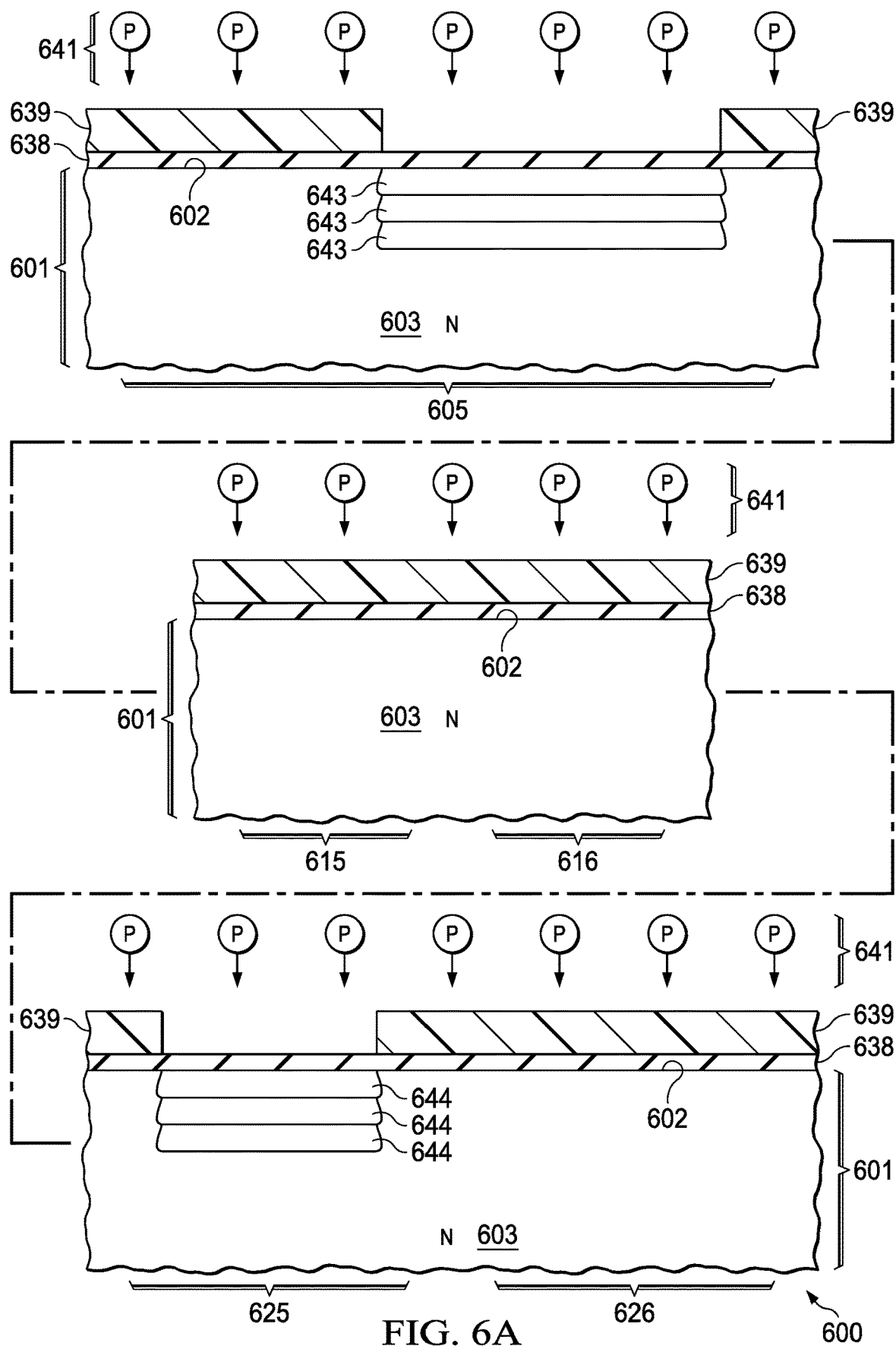
FIG. 6A through FIG. 6D are cross sections of an integrated circuit which includes an extended drain MOS transistor with dual well isolation, depicted in stages of a further example method of formation.

FIG. 6A through FIG. 6D are cross sections of an integrated circuit which includes an extended drain MOS transistor with dual well isolation, depicted in stages of a further example method of formation. Referring to FIG. 6A, formation of the integrated circuit 600 includes acquiring a substrate 601, which may be implemented as disclosed in reference to the substrate 201 of FIG. 2A. The substrate 601 has a top surface 602, and includes a lower layer 603 of a semiconductor material, below the top surface 602. The lower layer 603 has a first conductivity type, n-type in this example, as indicated in FIG. 6A. The substrate 601 includes an area for the extended drain MOS transistor 605, an area for a first low voltage MOS transistor 615, an area for a second low voltage MOS transistor 616, an area for a first high voltage MOS transistor 625, and an area for a second high voltage MOS transistor 626. The terms "low voltage" and "high voltage" are used as described in reference to FIG. 1.

A protective layer 638 may be formed on the top surface 602. The protective layer 638 may have a composition and structure as described in reference to the protective layer 238 of FIG. 2A. A first implant mask 639 is formed over the protective layer 638. The first implant mask 639 exposes the protective layer 638 in an area for a subsequently-formed drain isolation well 612, shown in FIG. 6B, in the area for the extended drain MOS transistor 605. The first implant mask 639 may optionally expose an area for a subsequently-formed third well 630, shown in FIG. 6B, in the area for the first high voltage MOS transistor 625. The first implant mask 639 may be formed as disclosed in reference to the first implant mask 239 of FIG. 2A.

First dopants 641 are implanted into the substrate 601 in the areas exposed by the first implant mask 639, to form a plurality of drain isolation implanted regions 643 that are vertically arrayed in the area for the extended drain MOS transistor 605, and to form well implanted regions 644 that are vertically arrayed in the area for the first high voltage MOS transistor 625. In this example, the drain isolation implanted regions 643 correspond to the implants of the first dopants 641 that are implanted at different implant energies. The first dopants 641 are dopants of the second conductivity type, in this example, p-type dopants such as boron. The first dopants 641 may be implanted at a total dose of $10^{12}$ cm$^{-2}$ to $10^{14}$ cm$^{-2}$, with implant energies of 100 keV to 1000 keV, to form the well implanted regions 644 in the vertically arrayed configuration. Having the plurality of drain isolation implanted regions 643 in the area for the extended drain MOS transistor 605, and the well implanted regions 644 in the area for the first high voltage MOS transistor 625 may provide more uniform vertical dopant distributions in a subsequently-formed drain isolation well 612, shown in FIG. 6B, and in a subsequently-formed third well 630, shown in FIG. 6B. The first implant mask 639 is removed after the first dopants 641 are implanted.

Figure 6B:
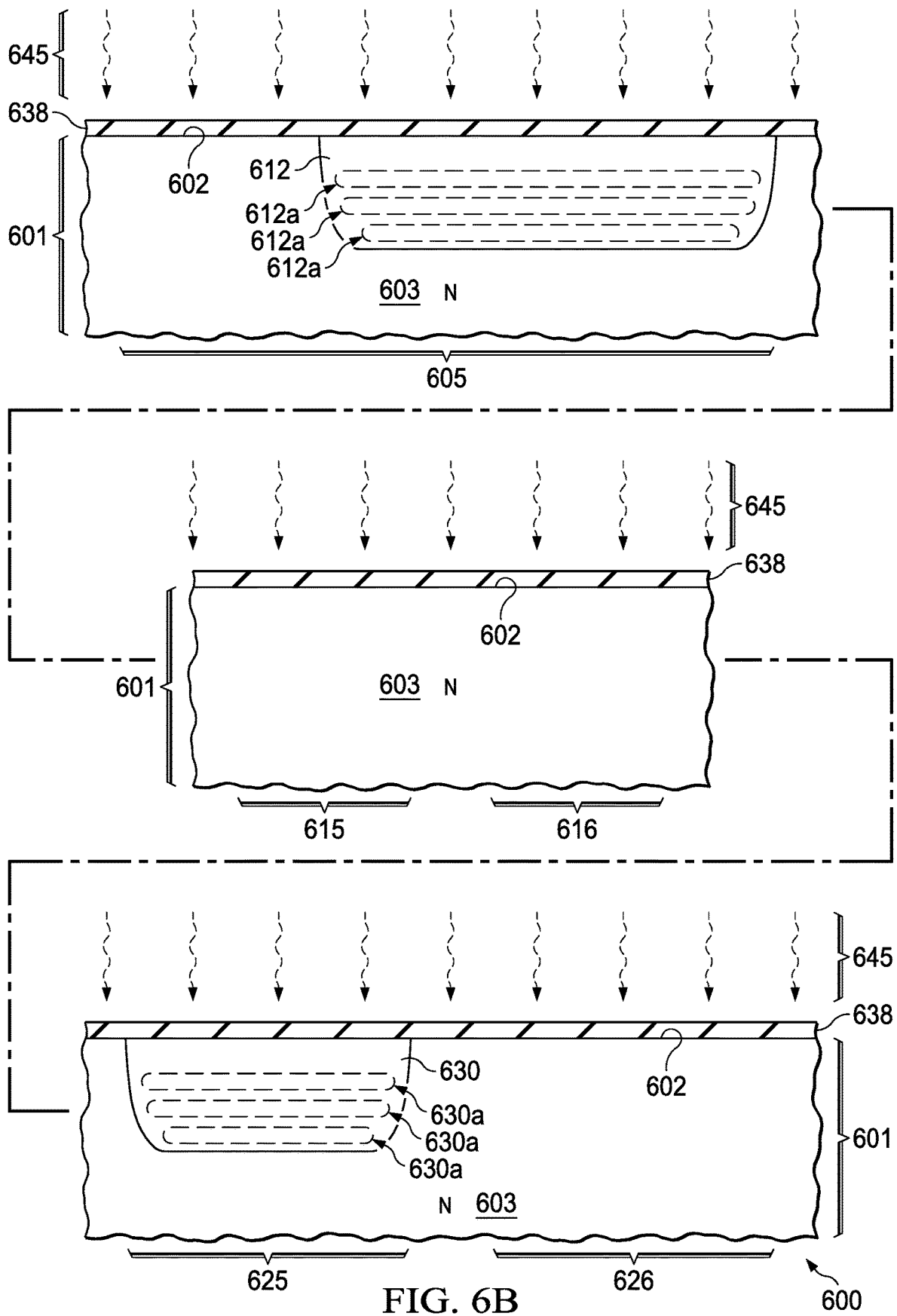

Referring to FIG. 6B, the substrate 601 is heated by a thermal process 645 to diffuse and activate the first dopants 641 of FIG. 6A in the drain isolation implanted regions 643 and the well implanted regions 644 of FIG. 6A, to form the drain isolation well 612 and the third well 630, respectively. The thermal process 645 may have a thermal profile sufficient to diffuse the first dopants 641 sufficiently to form a continuous drain isolation well 612 from the drain isolation implanted regions 643, and to form a continuous third well 630 from the well implanted regions 644, as indicated in FIG. 6B. Having the plurality of the drain isolation implanted regions 643 may result in a plurality of regions 612a of higher dopant density of the second conductivity type, vertically adjacent to each other, in the drain isolation well 612, with each region 612a corresponding to a drain isolation implanted region 643. Similarly, having the plurality of the well implanted regions 644 may result in a plurality of regions 630a of higher dopant density of the second conductivity type, vertically adjacent to each other, in the third well 630, with each region 630a corresponding to a drain isolation implanted region 643. By way of example, the thermal process 645 may heat the substrate 601 to 1080° C. to 1120° C. for 100 minutes to 300 minutes. The thermal process 645 may be implemented as disclosed in reference to FIG. 2B.

Figure 6C:
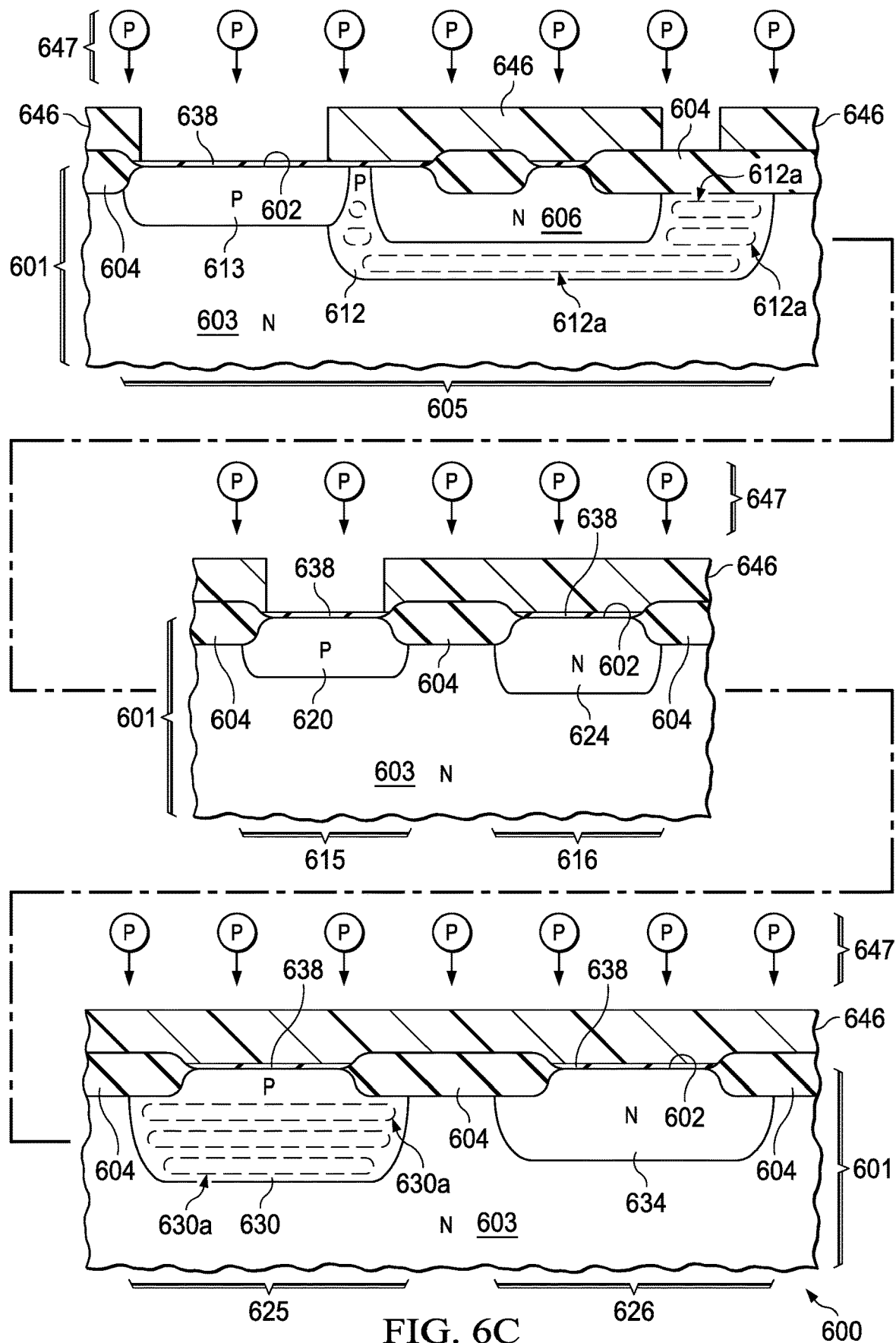

Referring to FIG. 6C, a field oxide layer 604 is formed which extends into the substrate 601. The field oxide layer 604 may be formed by a LOCOS process, so that the field oxide layer 604 has the LOCOS structure depicted in FIG. 6C. An example LOCOS process includes forming a silicon nitride layer over the protective layer 638, patterning the silicon nitride layer to expose the protective layer 638 in areas for the field oxide layer 604, growing the field oxide layer 604 by a thermal oxidation process, and removing the silicon nitride layer. After the field oxide layer 604 is formed, the protective layer 638 may be augmented by a new layer of protective material such as a new layer of silicon dioxide, formed by a thermal oxidation process.

A fourth well 634 may be formed in the area for the second high voltage MOS transistor 626. The fourth well 634 has the first conductivity type, n-type in this example, as indicated in FIG. 6C.

A second implant mask 646 is formed over the protective layer 638. The second implant mask 646 exposes the protective layer 638 in an area for a subsequently-formed body well 613 in the area for the extended drain MOS transistor 605. The second implant mask 646 may optionally expose an area for a subsequently-formed first well 620 in the area for the first low voltage MOS transistor 615. The second implant mask 646 may be formed by a similar process as the first implant mask 639 of FIG. 6A. Second dopants 647 are implanted into the substrate 601 in the areas exposed by the second implant mask 646. The second dopants 647 are dopants of the second conductivity type, p-type dopants such as boron, in this example. The second dopants 647 may be implanted in more than one implant step, with a main step having a dose of $10^{12}$ cm$^{-2}$ to $10^{14}$ cm$^{-2}$ of phosphorus, implanted at an energy of 400 keV to 600 keV. Additional implant steps of the second dopants 647 may have lower doses and lower energies, to set threshold potentials for the extended drain MOS transistor 605 and the first low voltage MOS transistor 615. The second implant mask 646 is removed after the second dopants 647 are implanted. The second implant mask 646 may be removed by a similar process as that used to remove the first implant mask 639 of FIG. 6A.

The substrate 601 is subsequently heated to activate the second dopants 647 that were implanted into the substrate 601, to form the body well 613 and the first well 620. The substrate 601 may be heated by a rapid thermal process, to reduce unwanted diffusion of the second dopants 647 and the first dopants 641 of FIG. 6A in the drain isolation well 612. The body well 613 has a higher average dopant density of the second conductivity type than the drain isolation well 612.

Figure 6D:
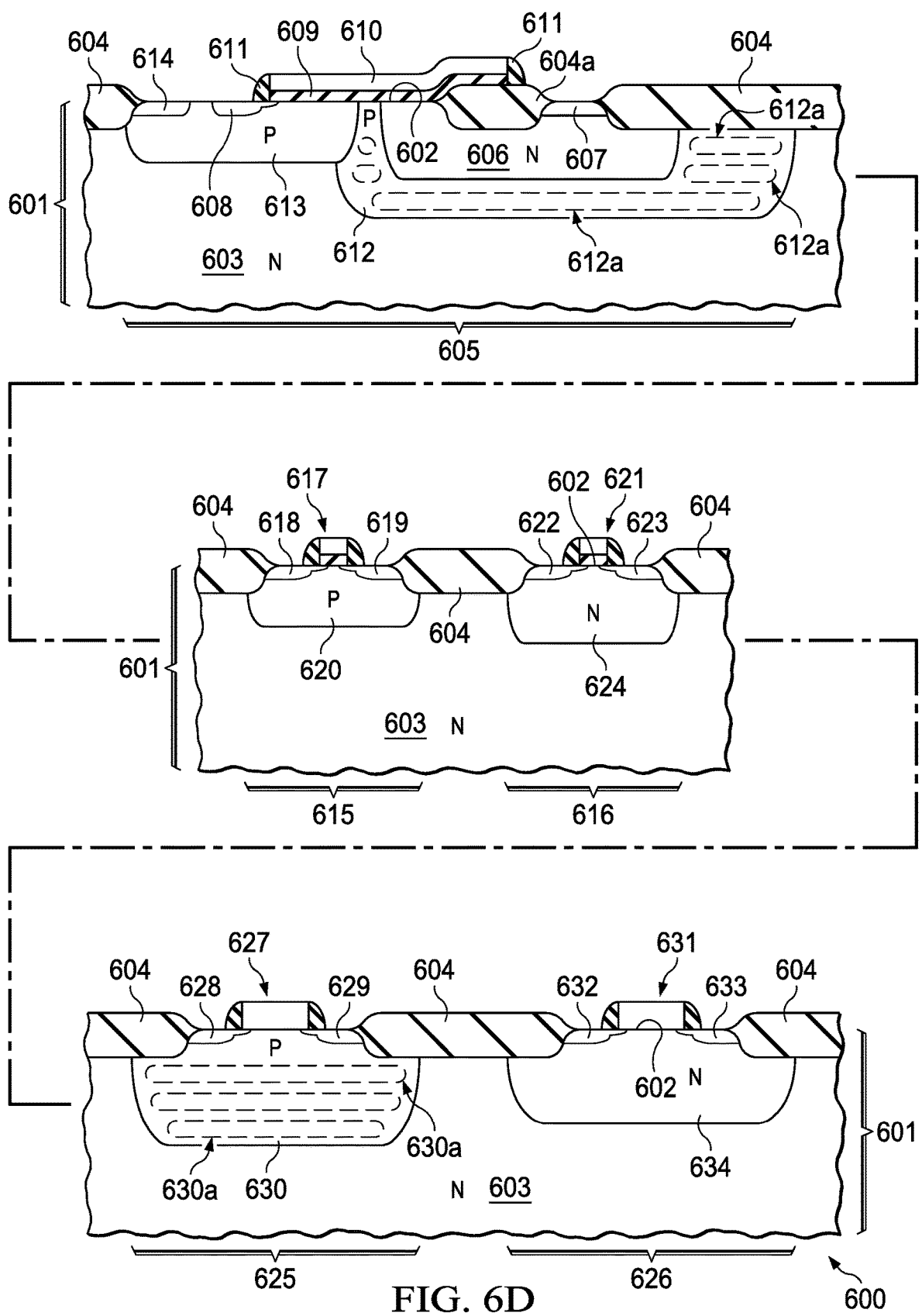

Referring to FIG. 6D, a drain well 606 is formed in the substrate 601 in the area for the extended drain MOS transistor 605, so that the drain well 606 is vertically separated from the lower layer 603 by the drain isolation well 612. The drain well 606 may extend partway under the gate 610, as depicted in FIG. 6D, so that the drain well 606 is laterally separated from the body well 613 under the gate 610 by the drain isolation well 612. The drain well 606 of this example is formed so as to extend under the element of the field oxide layer 604a. The drain well 606 has the first conductivity type; n-type in this example.

A second well 624 may be formed in the substrate 601 in the area for the second low voltage MOS transistor 616. The second well 624 has the first conductivity type, and may be formed to have a similar distribution of dopants of the first conductivity type as the drain well 606. The drain well 606 and the second well 624 may be formed concurrently as disclosed in reference to the drain well 206 and the second well 224 of FIG. 2D, accruing a similar advantage of fabrication cost reduction. The protective layer 638 of FIG. 6C is subsequently removed.

A gate dielectric layer 609 is formed on the top surface 602 of the substrate 601 in the area for the extended drain MOS transistor 605. A gate 610 of the extended drain MOS transistor 605 is formed on the gate dielectric layer 609. The gate 610 and the gate dielectric layer 609 may be formed as disclosed in reference to the gate 210 and the gate dielectric layer 209 of FIG. 2D. In this example, the gate 610 may extend from the source region 608 to the element of the field oxide layer 604a in the drain well 606. Gate sidewall spacers 611 may be formed on lateral surfaces of the gate 610. The gate sidewall spacers 611 may be formed as disclosed in reference to the gate sidewall spacers 211 of FIG. 2D.

A first low voltage gate structure 617 is formed on the top surface 602 of the substrate 601 in the area for the first low voltage MOS transistor 615. A second low voltage gate structure 621 is formed on the top surface 602 of the substrate 601 in the area for the second low voltage MOS transistor 616. A first high voltage gate structure 627 is formed on the top surface 602 of the substrate 601 in the area for the first high voltage MOS transistor 625. A second high voltage gate structure 631 is formed on the top surface 602 of the substrate 601 in the area for the second high voltage MOS transistor 626. Portions or all of the first low voltage gate structure 617, the second low voltage gate structure 621, the first high voltage gate structure 627 and the second high voltage gate structure 631 may be formed concurrently with the gate dielectric layer 609, the gate 610, and the gate sidewall spacers 611 of the extended drain MOS transistor 605.

A source region 608 is formed in the substrate 601, contacting the body well 613 adjacent to the gate 610, and located opposite from the drain well 606. The source region 608 has the first conductivity type; in this example, the source region 608 is n-type. The source region 608 may be formed as disclosed in reference to the source region 208 of FIG. 2D. A drain contact region 607 may optionally be formed in the substrate 601, contacting the drain well 606. The drain contact region 607 has the first conductivity type; in this example, the drain contact region 607 is n-type. The drain contact region 607 may be formed concurrently with the source region 608. A first source 618 and a first drain 619 are formed in the substrate 601 in the area for the first low voltage MOS transistor 615, on opposite sides of the first low voltage gate structure 617. A third source 628 and a third drain 629 are formed in the substrate 601 in the area for the first high voltage MOS transistor 625, on opposite sides of the first high voltage gate structure 627. The first source 618, the first drain 619, the third source 628, and the third drain 629 have the first conductivity type; in this example, the first source 618, the first drain 619, the third source 628, and the third drain 629 are n-type. The first source 618, the first drain 619, the third source 628, and the third drain 629 may be formed concurrently with the source region 608.

A body contact region 614 may optionally be formed in the substrate 601, contacting the body well 613. The body contact region 614 has the second conductivity type; in this example, the body contact region 614 is p-type. The body contact region 614 may be formed as disclosed in reference to the body contact region 214 of FIG. 2D. A second source 622 and a second drain 623 are formed in the substrate 601 in the area for the second low voltage MOS transistor 616, on opposite sides of the second low voltage gate structure 621. A fourth source 632 and a fourth drain 633 are formed in the substrate 601 in the area for the second high voltage MOS transistor 626, on opposite sides of the second high voltage gate structure 631. The second source 622, the second drain 623, the fourth source 632, and the fourth drain 633 have the second conductivity type; in this example, the second source 622, the second drain 623, the fourth source 632, and the fourth drain 633 are p-type. The second source 622, the second drain 623, the fourth source 632, and the fourth drain 633 may be formed concurrently with the body contact region 614.

Formation of the integrated circuit 600 may be continued by forming a dielectric layer, not shown in FIG. 6D, over the top surface 602 of the substrate 601, similar to the dielectric layer 535 of FIG. 5. Contacts, not shown in FIG. 6D, may be formed through the dielectric layer, similar to the contacts 536 of FIG. 5. Interconnects, not shown in FIG. 6D, may be formed on the dielectric layer, making electrical connections to the contacts, similar to the interconnects 537 of FIG. 5.

Various features of the examples disclosed herein may be combined in other manifestations of example integrated circuits. Any of the extended drain MOS transistors 105, 305, and 505 may have symmetric or asymmetric configurations, Any of the extended drain MOS transistors 105, 305, and 505 may have p-channel polarity or have n-channel polarity, with appropriate changes to the first conductivity type and the second conductivity type. Any of the extended drain MOS transistors 105, 305, and 505 may have elements of field oxide in the corresponding drain well 106, 306, and 506. Any of the extended drain MOS transistors 105, 305, and 505 may have STI or LOCOS field oxide. Any of the extended drain MOS transistors 105, 305, and 505 may have metal silicide, and may have silicide block layers. Any of the drain isolation wells 112, 312, and 512 may be formed according to the example methods disclosed in reference to FIG. 2A and FIG. 2B, FIG. 4A and FIG. 4B, or FIG. 6A and FIG. 6B.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming an integrated circuit, comprising:
    forming a first doped region in a substrate, the substrate having a lower layer of a first conductivity type, the first doped region having a second conductivity type, opposite from the first conductivity type, wherein the first doped region contacts the lower layer;
    forming a second doped region in the substrate, the second doped region having the second conductivity type, wherein the second doped region contacts the lower layer;
    forming a third doped region in the substrate, the third doped region having the first conductivity type, wherein the third doped region contacts the first doped region, and the third doped region is separated from the lower layer by the first doped region;
    forming a source region in the substrate, the source region having the first conductivity type, wherein the source region contacts the second doped region, and the source region is separated from the lower layer by the second doped region;
    forming a drain contact region in the substrate in the third doped region;
    forming a silicide block layer over the substrate between a gate of an extended drain MOS transistor and the drain contact region; and
    forming metal silicide on the drain contact region, the substrate between the gate and the drain contact region being free of the metal silicide.

2. The method of claim 1, wherein an average dopant density of dopants of the second conductivity type in the first doped region is less than an average dopant density of dopants of the second conductivity type in the second doped region.

3. The method of claim 1, wherein forming the first doped region includes:
    forming an implant mask which exposes an area having a lateral dimension in one direction that is less than half of a lateral dimension of the first doped region in the same direction, wherein lateral refers to a direction parallel to a top surface of the substrate;
    implanting dopants of the second conductivity type into the substrate where exposed by the implant mask;
    removing the implant mask; and
    heating the substrate to diffuse and activate the dopants in the substrate.

4. The method of claim 1, wherein forming the first doped region includes:
    forming an implant mask which exposes a plurality of sub-areas in an area for an extended drain MOS transistor;
    implanting dopants of the second conductivity type into the substrate where exposed by the implant mask to form implanted regions, the implanted regions corresponding to the sub-areas;
    removing the implant mask; and
    heating the substrate to diffuse and activate the dopants in the substrate so that the first doped region is continuous across the implanted regions.

5. The method of claim 1, wherein forming the first doped region includes:
   implanting dopants of the second conductivity type into the substrate in a plurality of doses at different energies; and
   heating the substrate to diffuse and activate the dopants in the substrate.

6. The method of claim 1, wherein the first conductivity type is p-type and the second conductivity type is n-type.

7. The method of claim 1, wherein forming the first doped region includes:
   forming an implant mask which exposes an area for an extended drain MOS transistor and exposes an area for a well in an area for a MOS transistor;
   implanting dopants of the second conductivity type into the substrate where exposed by the implant mask to form an implanted region in the area for the extended drain MOS transistor, and to form a well implanted region in the area for the MOS transistor;
   removing the implant mask; and
   heating the substrate to diffuse and activate the dopants in the substrate to concurrently form the first doped region and the well.

8. The method of claim 1, wherein forming the second doped region includes:
   implanting dopants of the second conductivity type into the substrate in an area for an extended drain MOS transistor, and in an area for a well in an area for a MOS transistor; and
   heating the substrate to diffuse and activate the dopants in the substrate to concurrently form the second doped region and the well.

9. The method of claim 1, further comprising forming an element of a field oxide layer in the substrate, wherein the first doped region extends under the element of the field oxide layer.

10. A method of forming an integrated circuit, comprising:
    forming an extended drain MOS transistor by:
      forming a drain isolation region in the substrate, the substrate including a lower layer, the lower layer being p-type, the drain isolation region being n-type, wherein the drain isolation region contacts the lower layer;
      forming a body region in the substrate, the body region being n-type, wherein the body region contacts the lower layer, and wherein the body region is more heavily doped than the drain isolation region;
      forming a drain region in the substrate, the drain region being p-type, wherein the drain region contacts the drain isolation region, and the drain region is separated from the lower layer by the drain isolation region; and
      forming a source region in the substrate, the source region being p-type, wherein the source region contacts the body region, and the source region is separated from the lower layer by the body region.

11. A method of forming an integrated circuit, comprising:
    acquiring a substrate, the substrate including a lower layer of a semiconductor material, the lower layer having a first conductivity type;
    forming a drain isolation well in the substrate, the drain isolation well having a second conductivity type, opposite from the first conductivity type, wherein the drain isolation well contacts the lower layer;
    forming a body well in the substrate, the body well having the second conductivity type, wherein the body well contacts the lower layer, and wherein an average dopant density of dopants of the second conductivity type in the drain isolation well is less than an average dopant density of dopants of the second conductivity type in the body well;
    forming a drain well in the substrate, the drain well having the first conductivity type, wherein the drain well contacts the drain isolation well, and the drain well is separated from the lower layer by the drain isolation well; and
    forming a source region in the substrate, the source region having the first conductivity type, wherein the source region contacts the body well, and the source region is separated from the lower layer by the body well.

12. A method of forming an integrated circuit, comprising:
    acquiring a substrate, the substrate including a lower layer of a semiconductor material, the lower layer having a first conductivity type;
    forming a drain isolation well in the substrate, the drain isolation well having a second conductivity type, opposite from the first conductivity type, wherein the drain isolation well contacts the lower layer;
    forming a body well in the substrate, the body well having the second conductivity type, wherein the body well contacts the lower layer, and wherein an average dopant density of dopants of the second conductivity type in the drain isolation well is less than an average dopant density of dopants of the second conductivity type in the body well;
    forming a drain well in the substrate, the drain well having the first conductivity type, wherein the drain well contacts the drain isolation well, and the drain well is separated from the lower layer by the drain isolation well; and
    forming a source region in the substrate, the source region having the first conductivity type, wherein the source region contacts the body well, and the source region is separated from the lower layer by the body well, wherein forming the drain isolation well includes:
    forming an implant mask which exposes an area having a lateral dimension in one direction that is less than half of a lateral dimension of the drain isolation well in the same direction, wherein lateral refers to a direction parallel to a top surface of the substrate;
    implanting dopants of the second conductivity type into the substrate where exposed by the implant mask;
    removing the implant mask; and
    heating the substrate to diffuse and activate the dopants in the substrate.

13. A method of forming an integrated circuit, comprising:
    acquiring a substrate, the substrate including a lower layer of a semiconductor material, the lower layer having a first conductivity type;
    forming a drain isolation well in the substrate, the drain isolation well having a second conductivity type, opposite from the first conductivity type, wherein the drain isolation well contacts the lower layer;
    forming a body well in the substrate, the body well having the second conductivity type, wherein the body well contacts the lower layer, and wherein an average dopant density of dopants of the second conductivity type in the drain isolation well is less than an average dopant density of dopants of the second conductivity type in the body well;

forming a drain well in the substrate, the drain well having the first conductivity type, wherein the drain well contacts the drain isolation well, and the drain well is separated from the lower layer by the drain isolation well; and forming a source region in the substrate, the source region having the first conductivity type, wherein the source region contacts the body well, and the source region is separated from the lower layer by the body well, wherein forming the drain isolation well includes:

forming an implant mask which exposes a plurality of sub-areas in an area for the extended drain MOS transistor;

implanting dopants of the second conductivity type into the substrate where exposed by the implant mask to form drain isolation implanted regions, the drain isolation implanted regions corresponding to the sub-areas;

removing the implant mask; and heating the substrate to diffuse and activate the dopants in the substrate so that the drain isolation well is continuous across the drain isolation implanted regions.

14. A method of forming an integrated circuit, comprising:

acquiring a substrate, the substrate including a lower layer of a semiconductor material, the lower layer having a first conductivity type;

forming a drain isolation well in the substrate, the drain isolation well having a second conductivity type, opposite from the first conductivity type, wherein the drain isolation well contacts the lower layer;

forming a body well in the substrate, the body well having the second conductivity type, wherein the body well contacts the lower layer, and wherein an average dopant density of dopants of the second conductivity type in the drain isolation well is less than an average dopant density of dopants of the second conductivity type in the body well;

forming a drain well in the substrate, the drain well having the first conductivity type, wherein the drain well contacts the drain isolation well, and the drain well is separated from the lower layer by the drain isolation well; and forming a source region in the substrate, the source region having the first conductivity type, wherein the source region contacts the body well, and the source region is separated from the lower layer by the body well, wherein forming the drain isolation well includes:

implanting dopants of the second conductivity type into the substrate in a plurality of doses at different energies; and heating the substrate to diffuse and activate the dopants in the substrate.

15. The method of claim 11, wherein the first conductivity type is p-type and the second conductivity type is n-type.

16. A method of forming an integrated circuit, comprising:

acquiring a substrate, the substrate including a lower layer of a semiconductor material, the lower layer having a first conductivity type;

forming a drain isolation well in the substrate, the drain isolation well having a second conductivity type, opposite from the first conductivity type, wherein the drain isolation well contacts the lower layer;

forming a body well in the substrate, the body well having the second conductivity type, wherein the body well contacts the lower layer, and wherein an average dopant density of dopants of the second conductivity type in the drain isolation well is less than an average dopant density of dopants of the second conductivity type in the body well;

forming a drain well in the substrate, the drain well having the first conductivity type, wherein the drain well contacts the drain isolation well, and the drain well is separated from the lower layer by the drain isolation well; and forming a source region in the substrate, the source region having the first conductivity type, wherein the source region contacts the body well, and the source region is separated from the lower layer by the body well, wherein forming the drain isolation well includes:

forming an implant mask which exposes an area for the extended drain MOS transistor and exposes an area for a well in an area for a MOS transistor;

implanting dopants of the second conductivity type into the substrate where exposed by the implant mask to form a drain isolation implanted region in the area for the extended drain MOS transistor, and to form a well implanted region in the area for the MOS transistor;

removing the implant mask; and heating the substrate to diffuse and activate the dopants in the substrate to concurrently form the drain isolation implanted region and the well.

17. The method of claim 11, wherein forming the body well includes:

implanting dopants of the second conductivity type into the substrate in an area for the extended drain MOS transistor, and in an area for a well in an area for a MOS transistor; and heating the substrate to diffuse and activate the dopants in the substrate to concurrently form the body implanted region and the well.

18. The method of claim 11, including forming an element of a field oxide layer in the substrate, wherein the drain well extends under the element of the field oxide layer.

19. The method of claim 11, including:

forming a drain contact region in the substrate in the drain well;

forming a silicide block layer over the substrate between a gate of the extended drain MOS transistor and the drain contact region; and forming metal silicide on the drain contact region, the substrate between the gate and the drain contact region being free of the metal silicide.

20. The method of claim 16, wherein forming the body well includes:

implanting dopants of the second conductivity type into the substrate in an area for the extended drain MOS transistor, and in an area for a well in an area for a MOS transistor; and heating the substrate to diffuse and activate the dopants in the substrate to concurrently form the body implanted region and the well.

* * * * *